(12) United States Patent
Chang et al.

(10) Patent No.: US 8,282,850 B2
(45) Date of Patent: Oct. 9, 2012

(54) APPARATUS AND METHOD FOR CONTROLLING RELATIVE PARTICLE CONCENTRATIONS IN A PLASMA

(75) Inventors: Shih Ming Chang, Hsinchu (TW); Chi-Lun Lu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1131 days.

(21) Appl. No.: 11/624,857

(22) Filed: Jan. 19, 2007

(65) Prior Publication Data
US 2008/0102538 A1 May 1, 2008

Related U.S. Application Data

(63) Continuation of application No. 11/553,590, filed on Oct. 27, 2006, now Pat. No. 7,897,008.

(51) Int. Cl.
*C03C 15/00* (2006.01)
(52) U.S. Cl. .......... 216/67; 216/68; 216/70; 216/71
(58) Field of Classification Search .......... 216/67, 216/68, 70, 71
See application file for complete search history.

(56) References Cited

U.S. PATENT DOCUMENTS

| | | | |
|---|---|---|---|
| 3,667,830 A | 6/1972 | Rottmiller | |
| 3,681,103 A | 8/1972 | Brown | |
| 3,971,860 A | 7/1976 | Broers et al. | |
| 4,213,053 A | 7/1980 | Pfeiffer | |
| 4,264,711 A | 4/1981 | Greeneich | |
| 4,450,062 A | 5/1984 | Macaulay | |
| 4,463,265 A | 7/1984 | Owen et al. | |
| 4,498,010 A | 2/1985 | Biechler et al. | |
| 4,621,371 A | 11/1986 | Goton et al. | |
| 4,712,013 A | 12/1987 | Nishimura et al. | |
| 4,743,766 A | 5/1988 | Nakasuji et al. | |
| 4,746,587 A | 5/1988 | Nicholas | |
| 4,761,560 A | 8/1988 | Glendinning | |
| 4,812,962 A | 3/1989 | Witt | |
| 4,816,361 A | 3/1989 | Glendinning | |
| 4,998,020 A | 3/1991 | Misaka et al. | |
| 5,008,553 A | 4/1991 | Abe | |
| 5,057,462 A | 10/1991 | Eisenberg et al. | |
| 5,082,762 A | 1/1992 | Takahashi | |
| 5,097,138 A | 3/1992 | Wakabayashi et al. | |
| 5,112,466 A | 5/1992 | Ohta et al. | |
| 5,130,213 A | 7/1992 | Berger et al. | |
| 5,177,367 A | 1/1993 | Suzuki | |

(Continued)

FOREIGN PATENT DOCUMENTS
WO    2006/030895    3/2006

OTHER PUBLICATIONS

Office Action issued by the United State Patent and Trademark Office, U.S. Appl. No. 11/624,838, Oct. 13, 2009, 14 pages.

(Continued)

*Primary Examiner* — Binh X Tran
(74) *Attorney, Agent, or Firm* — Haynes and Boone, LLP

(57) ABSTRACT

An apparatus for controlling a plasma etching process includes plasma control structure that can vary a size of a plasma flow passage, vary a speed of plasma flowing through the plasma flow passage, vary plasma concentration flowing through the plasma flow passage, or a combination thereof.

15 Claims, 21 Drawing Sheets

U.S. PATENT DOCUMENTS

| | | | |
|---|---|---|---|
| 5,229,320 A | 7/1993 | Ugajin | |
| 5,241,185 A | 8/1993 | Meiri et al. | |
| 5,254,438 A | 10/1993 | Owen et al. | |
| 5,336,892 A | 8/1994 | Dobisz et al. | |
| 5,441,849 A | 8/1995 | Shiraishi et al. | |
| 5,518,572 A | 5/1996 | Kinoshita et al. | |
| 5,532,496 A | 7/1996 | Gaston | |
| 5,701,014 A | 12/1997 | Berger et al. | |
| 5,792,581 A | 8/1998 | Ohnuma | |
| 5,798,196 A | 8/1998 | Okino | |
| 5,808,310 A | 9/1998 | Yamashita et al. | |
| 5,825,040 A | 10/1998 | Marrian et al. | |
| 5,847,959 A | 12/1998 | Veneklasen et al. | |
| 5,888,682 A | 3/1999 | Nakasuji | |
| 5,986,765 A | 11/1999 | Nakasuji | |
| 5,994,009 A | 11/1999 | Tzu et al. | |
| 6,017,658 A | 1/2000 | Rhee et al. | |
| 6,087,048 A | 7/2000 | Suzaki et al. | |
| 6,110,395 A | 8/2000 | Gibson, Jr. | |
| 6,126,323 A | 10/2000 | Tange | |
| 6,143,129 A | 11/2000 | Savas et al. | |
| 6,162,323 A | 12/2000 | Koshimizu | |
| 6,361,911 B1 | 3/2002 | Tsai et al. | |
| 6,373,071 B1 | 4/2002 | Innes et al. | |
| 6,501,083 B1 | 12/2002 | Kamijo | |
| 6,521,010 B1 | 2/2003 | Katata | |
| 6,528,934 B1 | 3/2003 | Chen et al. | |
| 6,531,069 B1 | 3/2003 | Srivastava et al. | |
| 6,551,447 B1 | 4/2003 | Savas et al. | |
| 6,590,344 B2 | 7/2003 | Tao et al. | |
| 6,596,444 B2 | 7/2003 | Buck | |
| 6,642,530 B2 | 11/2003 | DeLaRosa | |
| 6,673,199 B1 | 1/2004 | Yamartino et al. | |
| 6,692,575 B1 | 2/2004 | Omstead et al. | |
| 6,828,573 B1 | 12/2004 | Kawano et al. | |
| 6,872,507 B2 | 3/2005 | Tzu et al. | |
| 7,202,169 B2 * | 4/2007 | Chen et al. | 438/689 |
| 2001/0027843 A1 * | 10/2001 | Komino et al. | 156/345 |
| 2002/0005252 A1 | 1/2002 | Masuda et al. | |
| 2002/0114897 A1 | 8/2002 | Sumiya et al. | |
| 2003/0094903 A1 | 5/2003 | Tao et al. | |
| 2003/0155079 A1 | 8/2003 | Bailey, III et al. | |
| 2003/0168588 A1 * | 9/2003 | Brailove et al. | 250/281 |
| 2004/0099213 A1 | 5/2004 | Adomaitis et al. | |
| 2004/0103844 A1 | 6/2004 | Chou et al. | |
| 2004/0149389 A1 | 8/2004 | Fink | |
| 2005/0214477 A1 * | 9/2005 | Hanawa et al. | 427/569 |
| 2006/0102286 A1 * | 5/2006 | Kim | 156/345.35 |
| 2007/0286967 A1 | 12/2007 | Ide et al. | |
| 2008/0099439 A1 | 5/2008 | Chang et al. | |
| 2008/0100214 A1 | 5/2008 | Chang et al. | |

OTHER PUBLICATIONS

S. Wolf et al., Silicon Processing for the VLSI Era—vol. 1—Process Technology, Second Edition, pp. 665-718.

Shih-Ming Chang and Shy-Jay Lin; "Self-Contained Proximity Effect Correction Inspiration for Advanced Lithography (Special);" U.S. Appl. No. 12/700,880, filed Feb. 5, 2010; 42 pages.

* cited by examiner

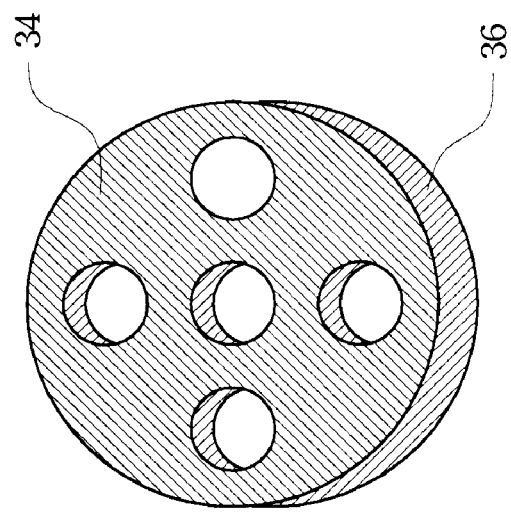
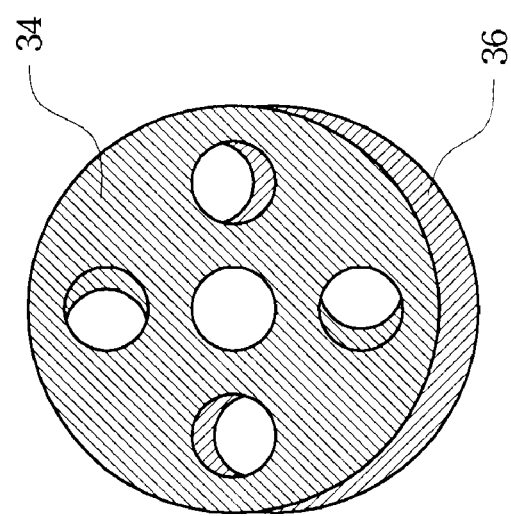
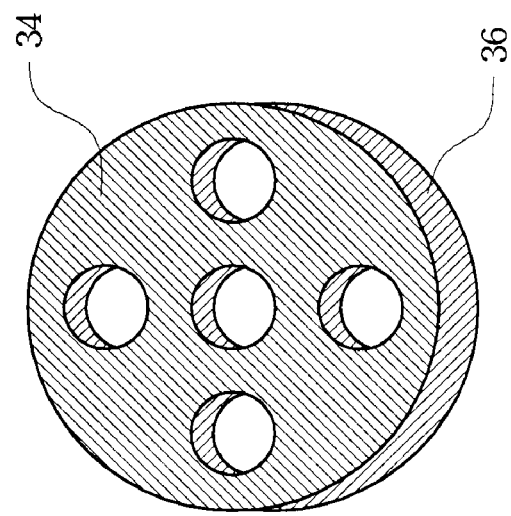
Fig. 11

US 8,282,850 B2

APPARATUS AND METHOD FOR CONTROLLING RELATIVE PARTICLE CONCENTRATIONS IN A PLASMA

This application is a continuation of and claims the benefit of U.S. Ser. No. 11/553,590 filed Oct. 27, 2006, now U.S. Pat. No. 7,897,008 which is hereby incorporated by reference.

BACKGROUND

The present disclosure relates in general to semiconductor fabrication and, more particularly, to an apparatus and a method for controlling plasma etching of a workpiece.

In integrated circuit (IC) manufacturing technology, a photoresist layer is typically applied to a semiconductor wafer surface, followed by exposure of the resist through a mask. A post-exposure baking process and a developing process are then performed to form a patterned resist layer with openings. After verification that the resist is within fabrication specifications, the wafer is etched to remove portions of the wafer exposed through the openings. Following etching of the wafer, the resist layer is stripped.

Dry etching is one etching technique that is used to remove portions of the wafer exposed through the openings of the resist layer. One exemplary dry etching technique is known as plasma etching. Plasma etching is often a preferred etching technique as it is generally faster, more selective, and less prone to radiation than other etching techniques. Plasma etching is also an isotropic etching technique and can be generally characterized by the following steps: 1) generation of reactive species from a relatively inert molecular gas; 2) diffusion of the reactive species to the surface of the wafer or other workpiece; 3) adsorption of the species on the surface of the wafer; 4) chemical reaction between the reactive species and the wafer surface yielding a volatile byproduct; 5) desorption of the byproduct; and 6) removal of the desorbed species. In short, a plasma (defined as a partially ionized gas composed of ions, electrons, and neutral species) is transported to and reacts with a surface of a wafer or other target. That reaction creates a byproduct that is removed thereby yielding an etched surface of the wafer. Plasma etching is often used for fine-line pattern definition, selective processing over topography, planarization, and resist stripping.

One manner of controlling the plasma etch process is through plasma flow distribution. For example, in conventional plasma etching chambers, a single sieve filter is positioned between the plasma source and the wafer to be plasma etched. The sieve filter generally has uniformly shaped and sized openings spaced from one another. Plasma is distributed uniformly across the surface of the wafer. Some plasma filters have been designed with non-uniformity in the size, shape, and density of the openings to non-uniformly control the distribution of the plasma. In this regard, different filters can be used to effectuate different etching profiles. For example, for radial global critical dimension uniformity (GCDU) error compensation, the sieve filter is constructed to have openings spaced radially about a larger central opening. For side-side GCDU error compensation, a sieve filter with a central opening sized to match all but one of a series of radially spaced openings will be used. The one radially spaced opening has a larger diameter than the other sieve filter openings.

Because conventional sieve filters are relatively easy to manufacture, sieve filters with different opening configurations (size, shape, and density) have been made to account for various plasma etching applications. Notwithstanding the numerous advantages of these filters; however, there is still a need to improve the flexibility of plasma flow control. That is, with conventional sieve filters, a trial-and-error approach is often required to determine the most appropriate opening configuration. Moreover, because the openings are of fixed size, if a change in plasma flow distribution is desired during a particular recipe, the sieve filter must be replaced.

Although the existing technologies have been generally adequate for their intended purposes, they have not been satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIG. 11 is a diagrammatic view of the filter assembly of FIGS. 1-2 showing relative positioning thereof over time.

DETAILED DESCRIPTION

Figure 1:
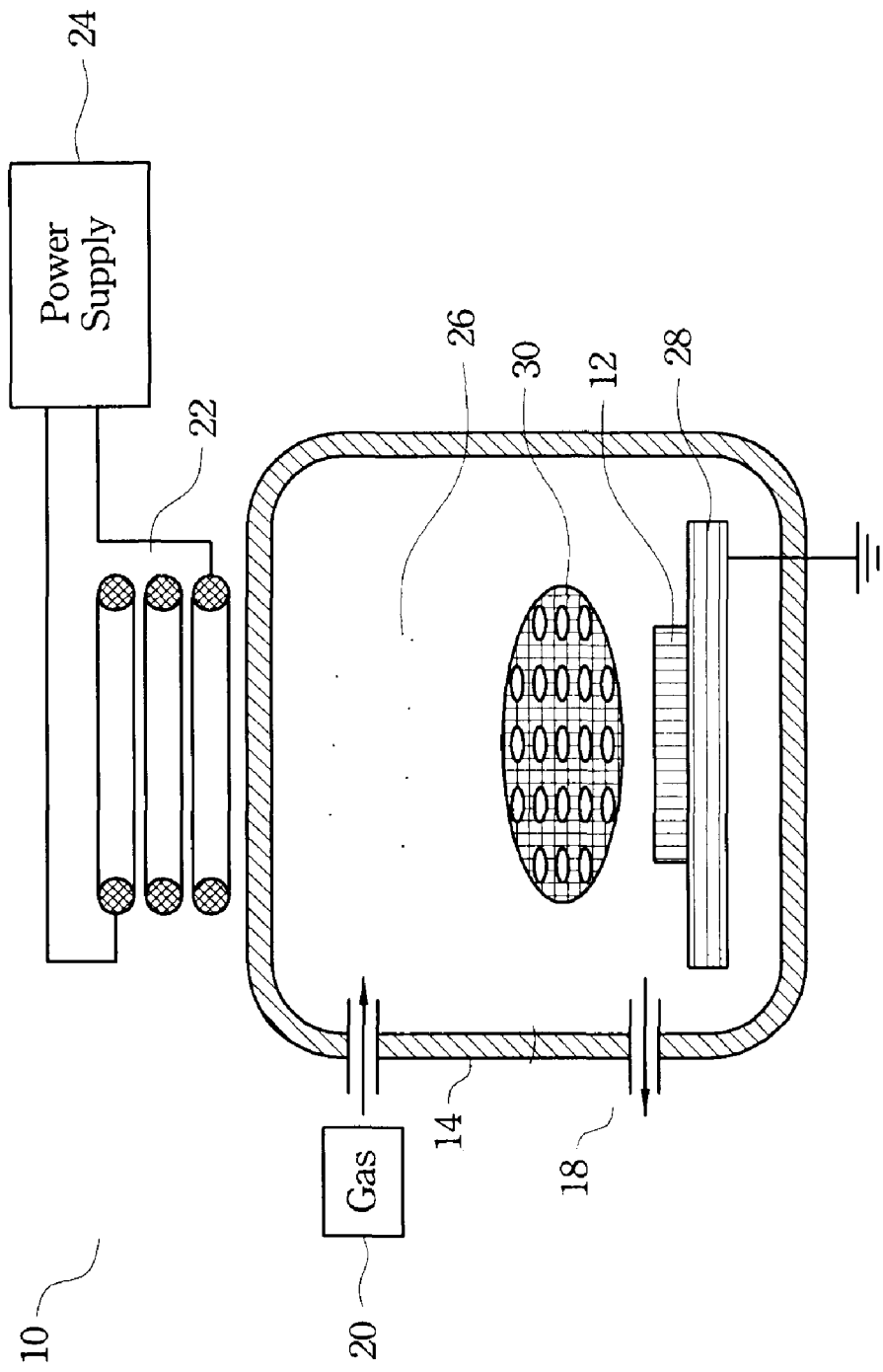
FIG. 1 is a diagrammatic view of a plasma etching system.

For the purposes of promoting an understanding of the principles of the invention, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates. Furthermore, the depiction of one or more elements in close proximity to each other does not otherwise preclude the existence of intervening elements. Also, reference numbers may be repeated throughout the embodiments, and this does not by itself indicate a requirement that features of one embodiment apply to another embodiment, even if they share the same reference number.

FIG. 1 is a diagrammatic view of a plasma etching system 10 according to one aspect of the present disclosure. The plasma etching system 10 is designed for plasma etching of a wafer 12. Alternatively, the plasma etching system 10 may be used for etching of a mask or other workpiece. The wafer 12 is formed of silicon. Alternatively, the wafer 12 may include another elementary semiconductor such as germanium. The wafer 12 may also include a compound semiconductor such as silicon carbide, gallium arsenic, indium arsenide, or indium phosphide. The wafer 12 may include an alloy semiconductor such as silicon germanium, silicon germanium carbide, gallium arsenic phosphide, or gallium indium phosphide. The wafer 12 may include an epitaxial layer. For example, the wafer may have an epitaxial layer overlying a bulk semiconductor. Furthermore, the wafer 12 may include a semiconductor-on-insulator (SOI) structure. For example, the wafer may include a buried oxide (BOX) layer formed by a process such as separation by implanted oxygen (SIMOX). The wafer 12 may include various p-type doped regions and/or n-type doped regions, implemented by a process such as ion implantation and/or diffusion. The wafer 12 may include other functional features such as resistor, capacitor, and gate structures. The wafer 12 may include lateral isolation features disposed to separate various devices formed thereon. The wafer 12 may further at least partially include a plurality of patterned dielectric layers and patterned conductive layers combined to form interconnections configured to couple the various p-type and n-type doped regions and the other functional features. For example, the wafer 12 may include a portion of a multi-layer interconnect (MLI) structure and an inter-level dielectric (ILD) disposed in the MLI structure.

The wafer 12 may also include a material layer (not shown) formed thereon that includes a dielectric material such as silicon oxide, silicon nitride, a low dielectric constant (low k) material, or a combination thereof. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials as examples. A process of forming the material layer may utilize chemical vapor deposition (CVD) or a spin-on coating. In another example, the workpiece may be a photoresist mask layer.

Referring again to FIG. 1, the plasma etching system 10 includes a vacuum chamber 14. An exhaust port 18 expels desorbed species from the vacuum chamber resulting from the reaction of plasma with the top surface of the wafer 12. A gas source 20 supplies gas, such as chlorine ($Cl_2$), carbon tetrafluoride ($CF_4$), or other chemically reactive gas, to the vacuum chamber 16. Other exemplary gases include, but are not limited to nitrogen trifluoride ($NF_3$), dichlorodifluoromethane ($CCl_2F_2$), borane ($BCl_3$), carbon tetrachloride ($CCl_4$), silane ($SiCl_4$), and oxygen ($O_2$). An RF antenna 22 is installed on the top of the vacuum chamber 14 and is coupled to an antenna power supply 24. High frequency electric power is supplied from the RF antenna 22 to the inside volume of the vacuum chamber 14.

A grounding electrode 28 supports the wafer 12. A plasma filter assembly 30 is situated between a plasma source 26 and the wafer 12.

The plasma etching system 10 described above utilizes an RF coil for supplying plasma-creating power to the interior volume of the vacuum chamber; however, the present disclosure is applicable with plasma etching systems that use different plasma-creating structures and/or techniques.

During plasma etching, the vacuum chamber 14 is decompressed by a vacuum exhaust device (not shown). Gas is then introduced into the vacuum chamber 14 by gas supply 20. The high frequency electric power supplied by the RF antenna 22 ionizes the gas inside the vacuum chamber 14 for generating plasma for etching of wafer 12. Plasma is directed from the plasma source 26 toward the wafer 12 that rests on grounding electrode 28, but the plasma first passes through plasma filter assembly 30. The plasma filter assembly 30 provides plasma control for etching of wafer 12.

FIG. 1 shows the plasma filter assembly 30, and various other embodiments of the plasma filter assembly are described later. As will be shown, differences in plasma flow size, concentration, distribution, and/or intensity can be used to tailor a plasma etch process for a given application and desired etching profile. In one exemplary embodiment, the speed by which plasma flows toward wafer 12 is controlled. In another exemplary embodiment, the size of plasma flow passage(s) is controlled, and in a further example, is varied on-the-fly or in real-time. In yet another embodiment, plasma particle concentration is controlled.

Figure 2:
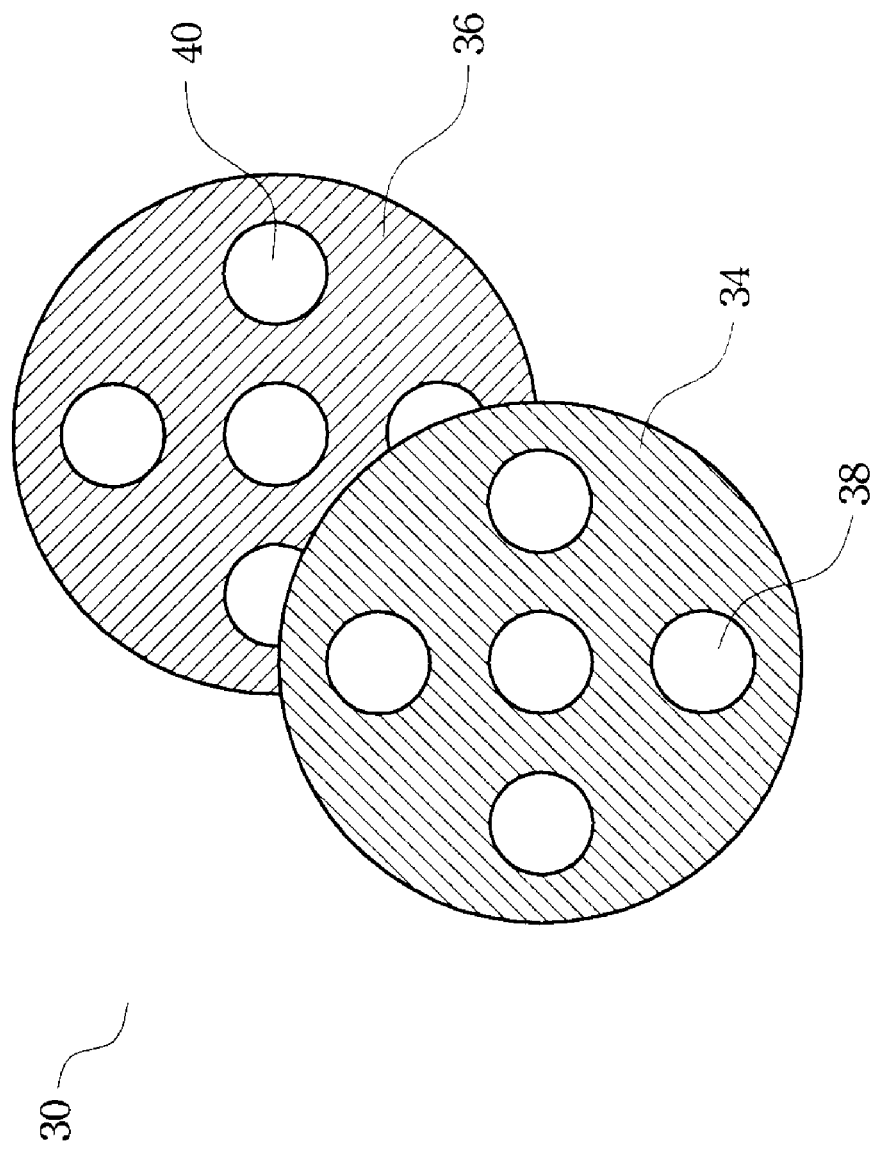
FIG. 2 is an exploded diagrammatic view of part of a filter assembly that is a component of the plasma etching system of FIG. 1.

FIG. 2 is an exploded diagrammatic view of part of a filter assembly that is a component of the plasma etching system of FIG. 1. Referring now to FIG. 2, plasma filter assembly 30 has multiple stencil filters. The plasma filter assembly 30 has a stencil filter 34 and a stencil filter 36. Each stencil filter 34 and 36 has a plurality of openings 38 and 40, respectively. The openings 38 and 40 are generally aligned with one another. Each pair of openings collectively defines a plasma flow passage. While the stencil filters are shown greatly spaced from one another, in implementation, the degree of spacing is minimal.

As will be described below, the stencil filters 34 and 46 are displaceable relative to one another. Relative movement of the stencil filters 34 and 36 is limited such that a line-of-sight is maintained through at least one pair of openings. Alternately, it is contemplated that the stencil filters can be moved relative to one another such that a line-of-sight is not maintained. It is contemplated that one or more of the plasma flow passages can be completely closed by relative movement of the stencil filters 34 and 36 to vary the distribution of plasma to the wafer. Further, in the illustrated example, the openings 38 and 40 are similarly sized and shaped; however, as will be shown, the openings may have different sizes and/or shapes.

Figure 3:
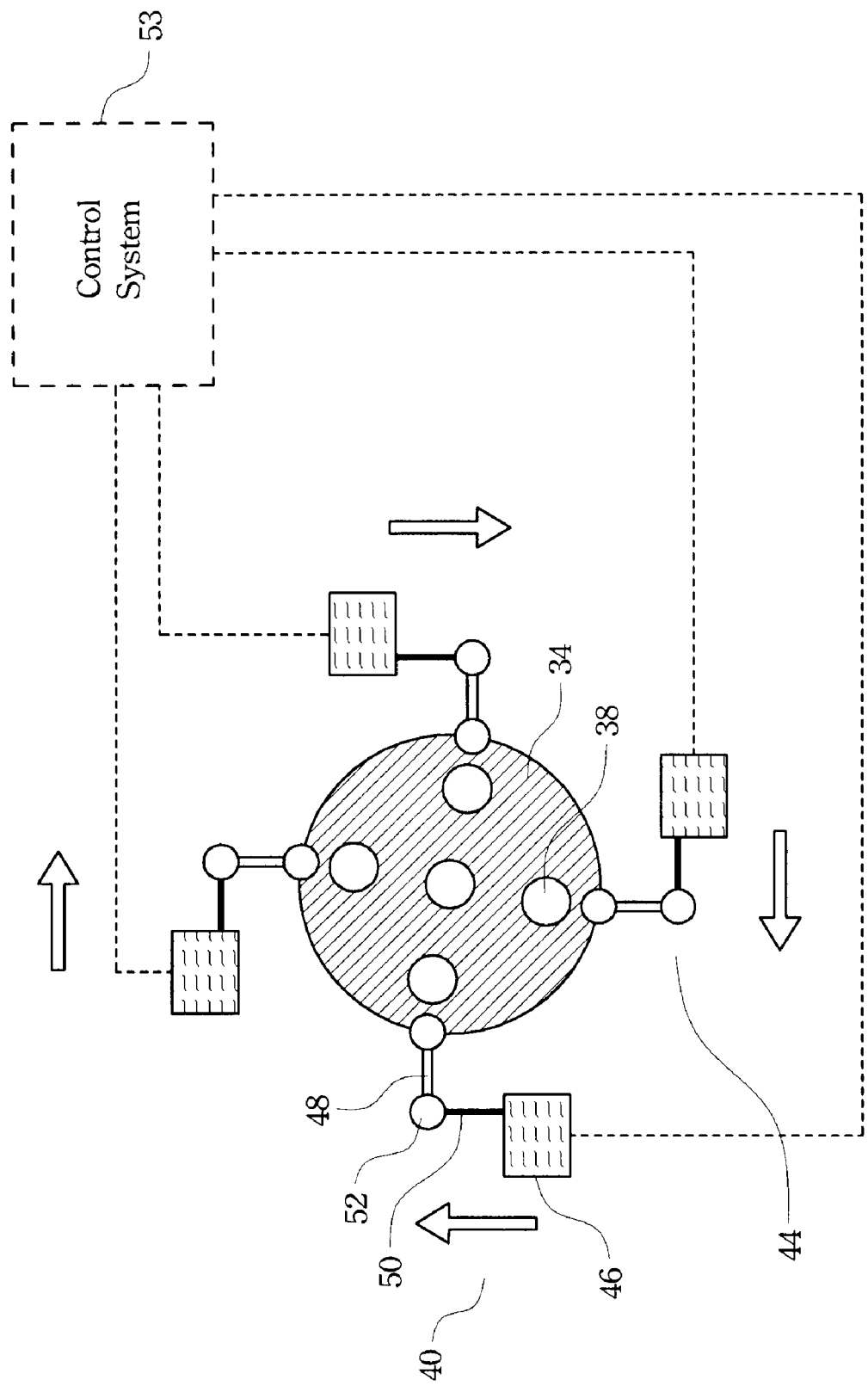
FIGS. 3-4 are diagrammatic views showing the filter assembly of FIG. 2 and a positioning assembly.
Figure 4:
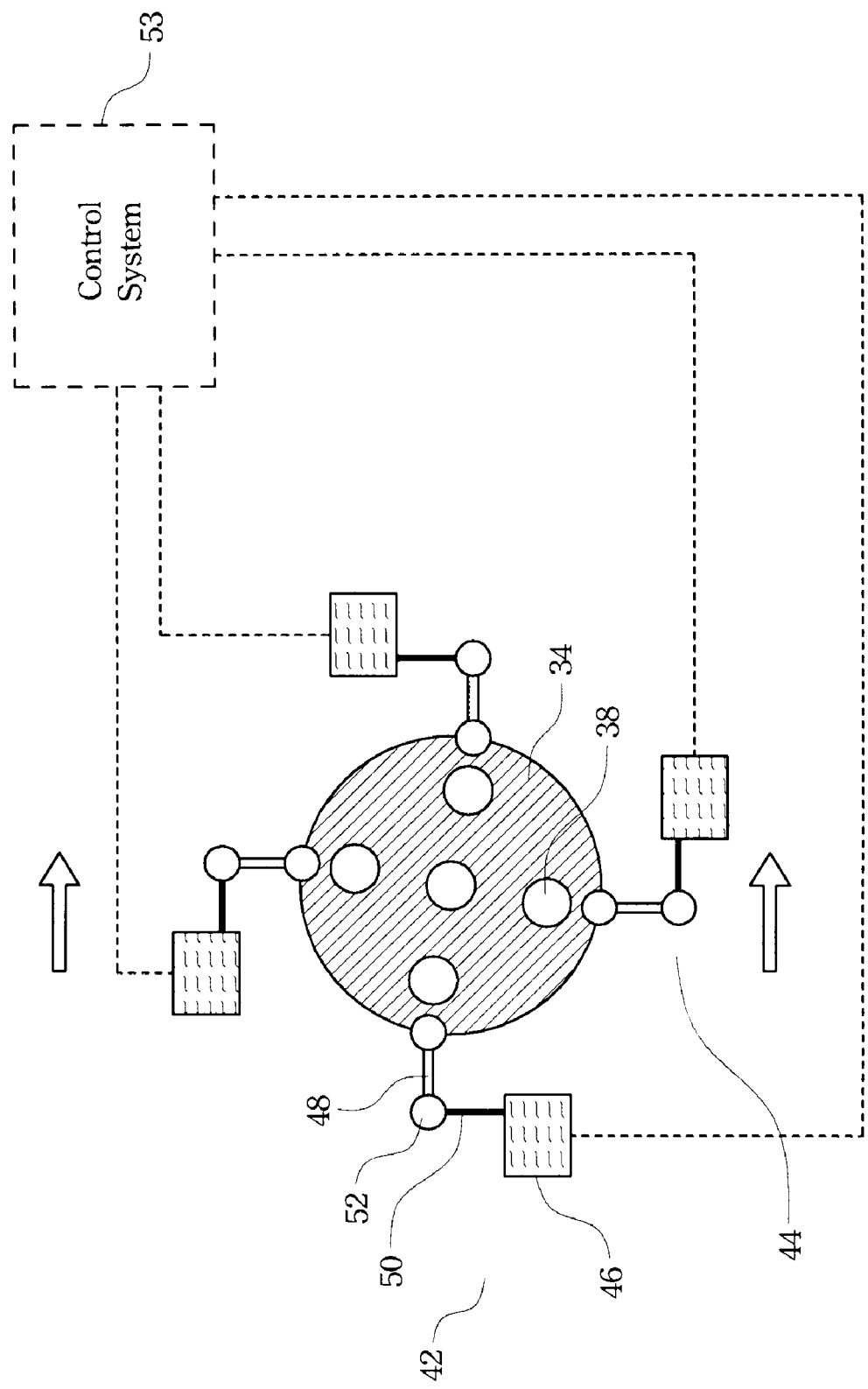

FIGS. 3-4 are diagrammatic views showing the filter assembly 30 of FIG. 2 and a positioning assembly. Referring now to FIGS. 3-4, four actuators 42, disposed at ninety degrees from one another, are coupled to effectuate movement of stencil filter 34. In the illustrated example, the four actuators operate, independently or in (partial) synchronicity, to slide, rotate, or otherwise move the stencil filter 34. Each actuator 42 includes a linkage 44 that couples an actuator driver 46 to the stencil filter 34. The linkage 44 includes a pair of arms 48 and 50 that operatively couple the driver 46 to the stencil filter 34. Arm 48 is fixedly coupled to the stencil filter 34 at one end and pivotally coupled to arm 50 via joint 52 at an opposite end. Joint 52 may be any of a number of known joint types, such as a ball joint. Arm 50 is coupled to driver 46 in a known manner. For example, arm 50 may be an arm that is extended and retracted by driver 46 to provide a desired displacement of stencil filter 34. In this regard, the actuator drivers 46 are independently driven by a controller 53 to move linkage 44 to effectuate the desired movement of the stencil filter 34.

Actuators 42 include stepper motors (not shown) for effectuating movement of stencil filter 34. Alternatively, the actuators may include hydraulic circuitry, pneumatic circuitry, mechanic circuitry, magnetic circuitry, or other electrical circuitry to move stencil filter 34. In this regard, the actuators 42 may include hydraulic or pneumatic pumps, or stepper motors, for example. In FIG. 3, the four actuators are each moving the stencil filter 34 clockwise by a displacement thereby effectuating rotation of the stencil filter. In FIG. 4, the stencil filter 34 is being moved rightward by the actuators 42. Additionally, while an actuator system has been described with respect to stencil filter 34, it is recognized that stencil filter 36 may also be coupled to an actuator system to effectuate movement thereof.

Also, while four actuators 42 are shown, it is contemplated that more than or fewer than four actuators may be used to effectuate movement of the stencil filter. It is also contemplated that each actuator can be moved independently of the other actuators. The stencil filter is movable in at least two dimensions.

Figure 5:
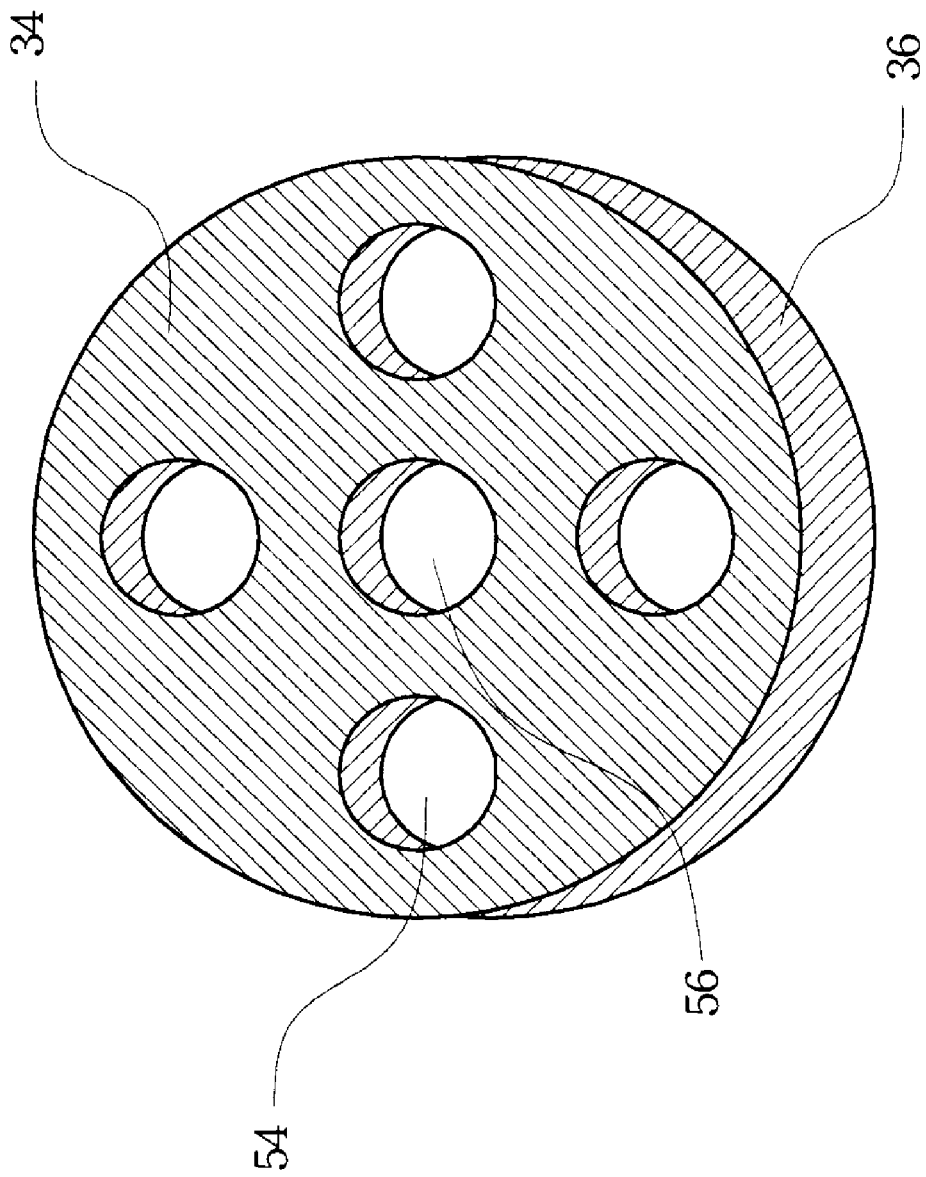
FIGS. 5-7 are diagrammatic top views of different operational positions of the filter assembly shown in FIG. 2.
Figure 6:
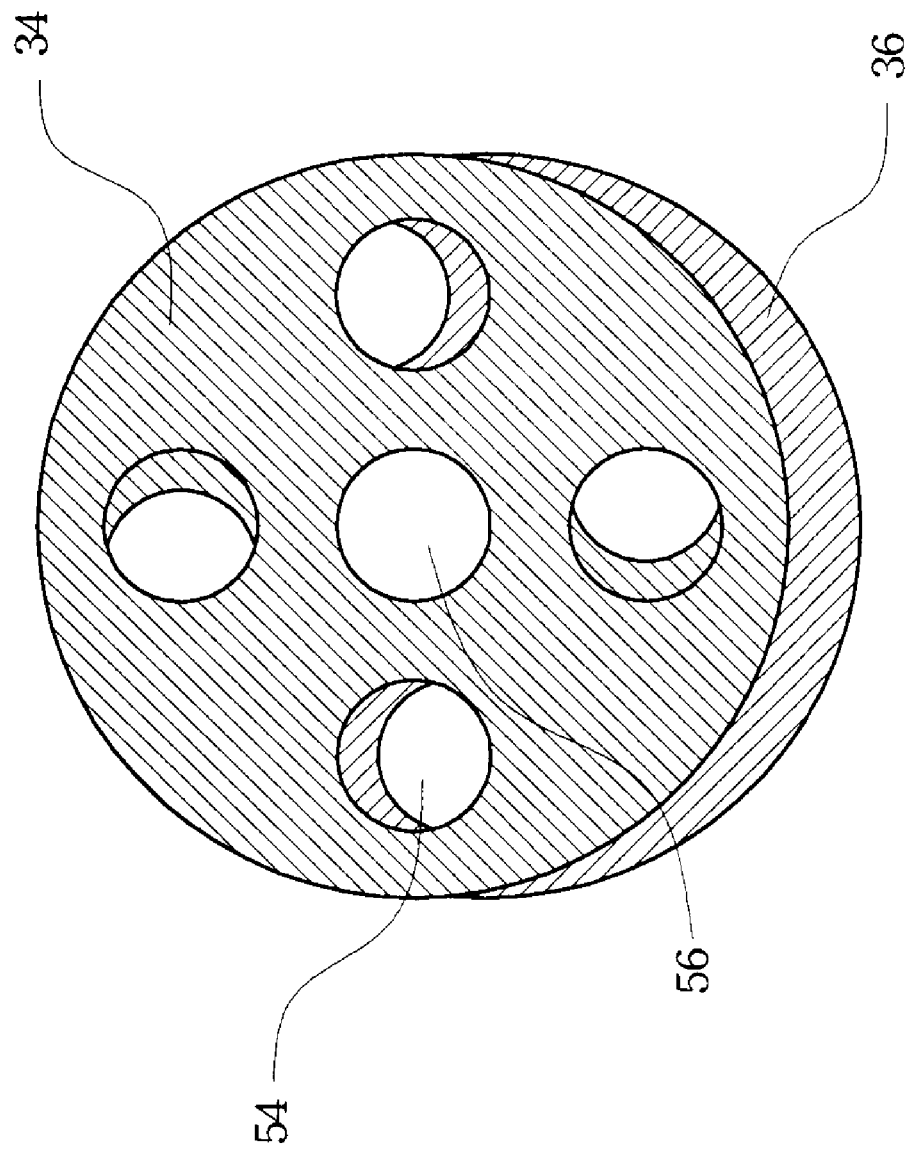
Figure 7:
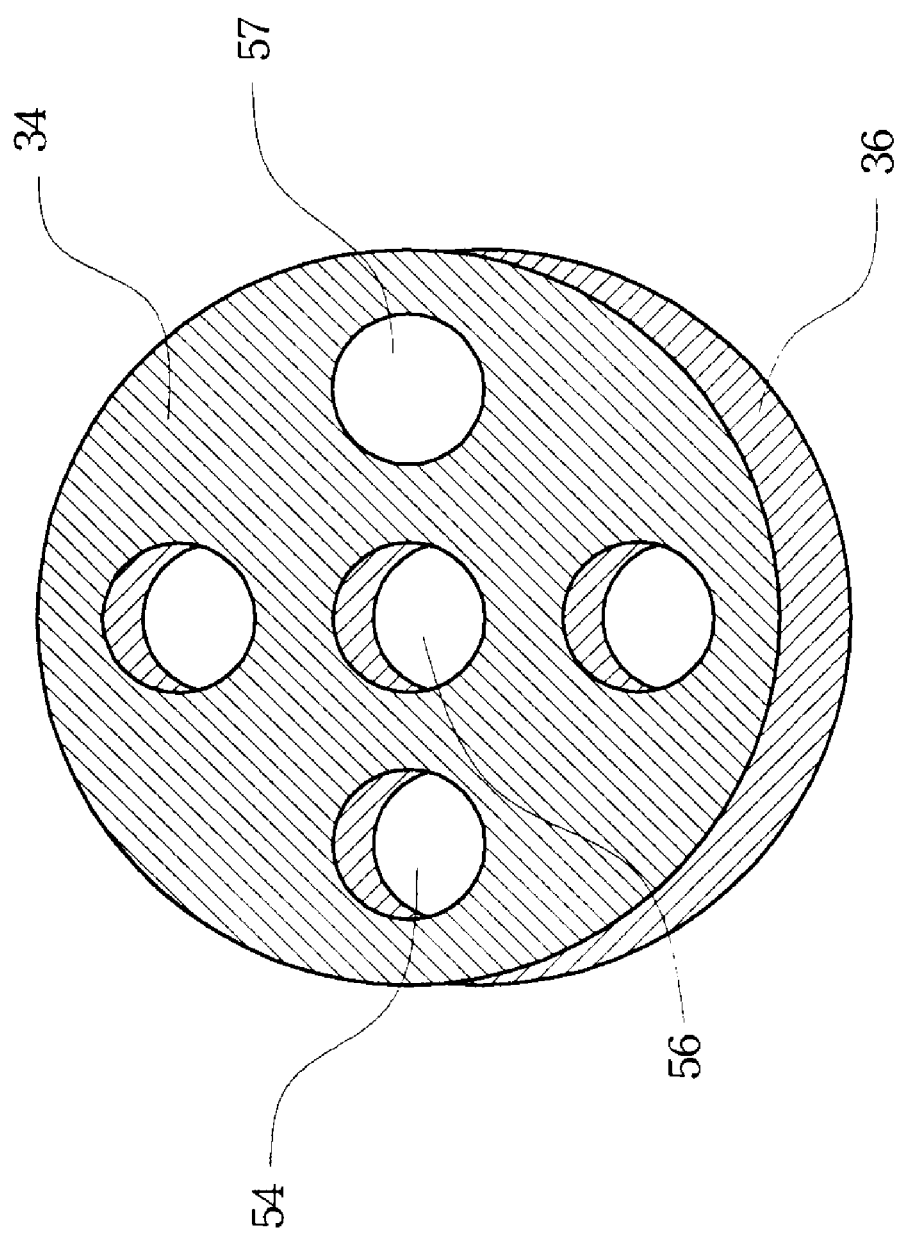

As referenced above, the stencil filters 34 and 36 are displaceable relative to one another to provide desired regional variations in plasma etch characteristics, such as plasma flow size, shape, and/or distribution. For example, the size of the respective plasma flow passage defined by each pair of generally aligned openings can be varied by changing the relative position of stencil filters 34 and 36. FIGS. 5-7 are diagrammatic top views of different operational positions of the filter assembly shown in FIG. 2.

Referring now to FIG. 5, stencil filters 34 and 36 are shown with upward displacement of stencil filter 34 relative to stencil filter 36 (or, alternatively, downward displacement of stencil filter 34 relative to stencil filter 36). The stencil filters 34 and 36 collectively define peripheral plasma flow passages 54 and a central plasma flow passage 56. As a result of the change in relative position of the stencil filters 34 and 36, the size of the plasma flow passages 54 and 56, for example, are reduced. As illustrated in FIG. 5, each of the plasma flow passages respectively defined by openings 54 and 56 is reduced in size.

In contrast, as shown in FIG. 6, the stencil filter 34 is rotationally displaced relative to stencil filter 36. The peripheral plasma flow passages 54 are reduced in size whereas the central plasma flow passage 56 remains unchanged in size. The stencil filters 34 and 36 are displaced relative to one another about an axis of rotation that extends through the central plasma flow passage 56.

In FIG. 7, the relative displacement of the stencil filters 34 and 36 is such that the central plasma flow passage 56 and all but one of the peripheral plasma flow passages 54 are reduced in size whereas the size of the remaining one of the peripheral plasma flow passages 57 remains unchanged. This asymmetrical variation in plasma flow passage size is as a result of rotating one of the stencil filters about an axis of rotation that extends through the one plasma flow passage that is unchanged in size.

As described above, stencil filters 34 and 36 are displaceable relative to one another to vary the size of one or more plasma flow passages 54 and 56 defined thereby. Stencil filter 34 has been described as being connected to actuators 42 to cause displacement thereof. However, in an alternate embodiment, stencil filter 36 may also include an actuator(s) to effectuate movement thereof.

The embodiment of FIGS. 1-7 has two stencil filters movable relative to one another to vary the size of one or more plasma flow passages. It is contemplated, however, that more than two stencil filters may used. In this regard, it is contemplated that all the stencil filters may be movable or fewer than all may be movable. As such, one or more of the stencil filters may be stationary while other stencil filters may be movable.

Figure 8:
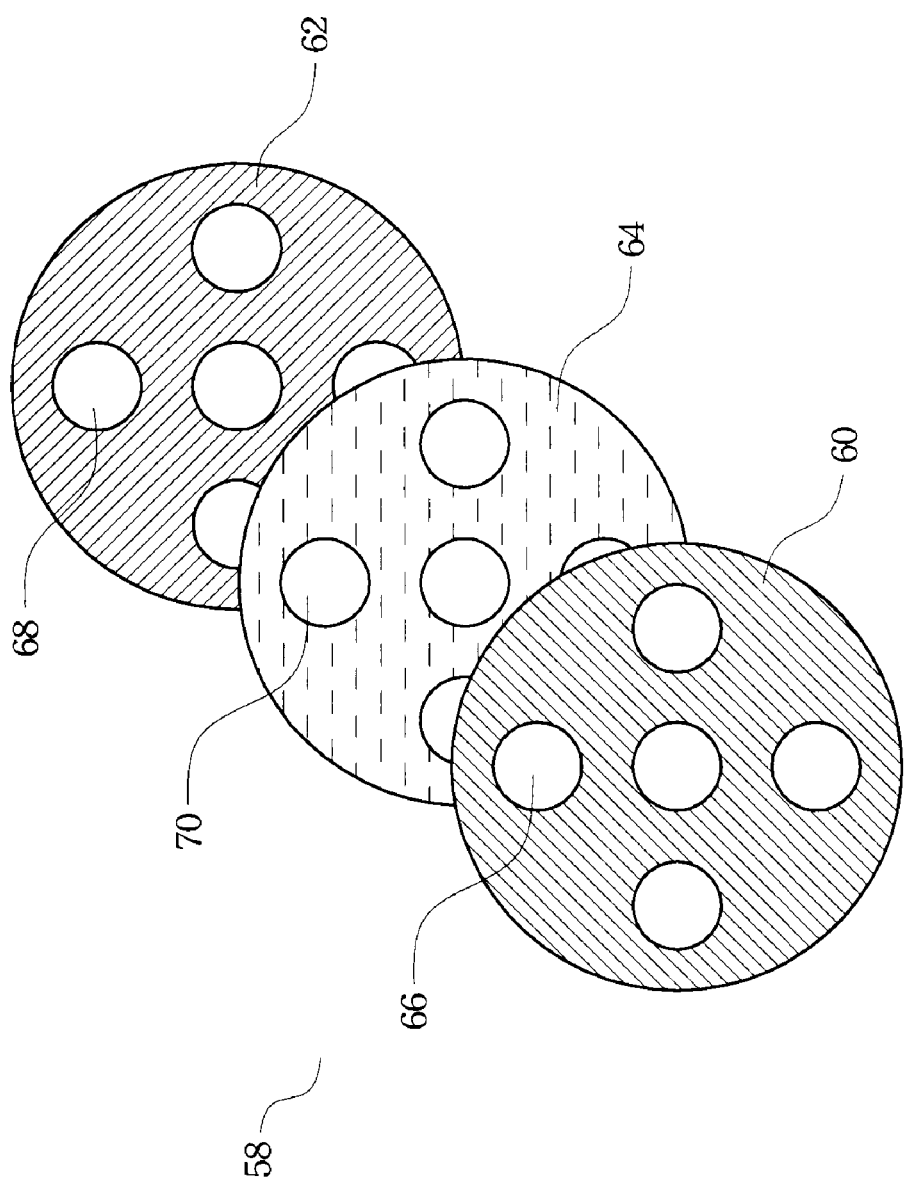
FIG. 8 is a diagrammatic exploded view of another filter assembly that is an alternative embodiment of the filter assembly of FIGS. 1-2.

FIG. 8 is a diagrammatic exploded view of another filter assembly that is an alternative embodiment of the filter assembly of FIGS. 1-2. In FIG. 8, a three stencil filter assembly 58 is shown. As illustrated, stencil filters 60 and 62 sandwich a third stencil filter 64. Each stencil filter 60, 62, and 64 has openings 66, 68, and 70, respectively, that collectively define a plurality of plasma flow passages. In FIG. 8, each of the openings 66, 68, and 70 are similarly sized and shaped. Moreover, all three stencil filters 60, 62, and 64 have the same number of openings.

Figure 9:
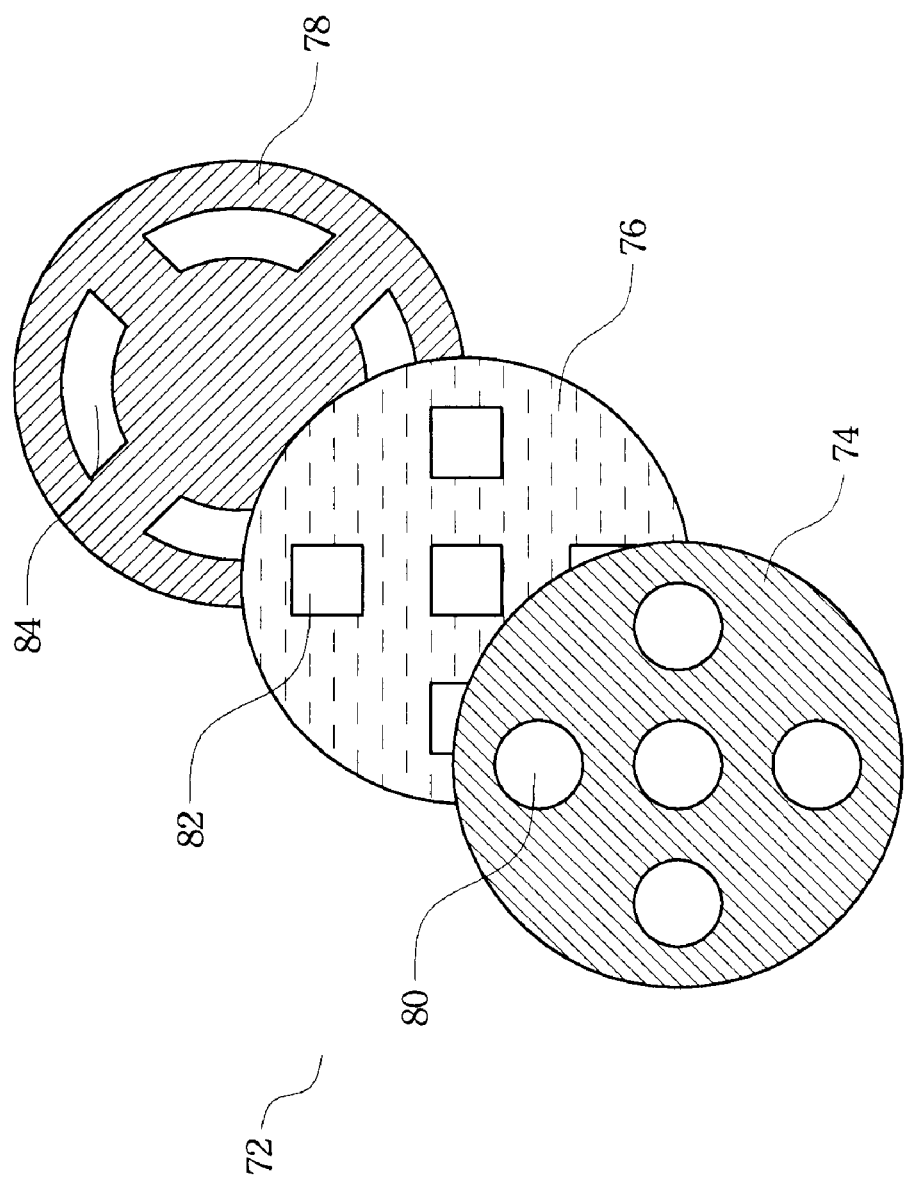
FIG. 9 is an exploded view of yet another filter assembly that is an alternative embodiment of the filter assembly of FIGS. 1-2.

FIG. 9 is an exploded view of another exemplary filter assembly 72 shown as having three stencil filters 74, 76, 78. The filter assembly 72 is a further alternate embodiment of the filter assembly 30 in FIG. 1. As illustrated, stencil filters 74, 76, and 78 each have different shaped openings. For example, openings 80 are circular whereas openings 82 are square and openings 84 have a truncated wedge shape. Moreover, stencil filters 74 and 76 each have five openings whereas stencil filter 78 has four openings. Stencil filter 78 lacks a centrally disposed opening. The openings for each stencil filter 74, 76, and 78 are uniformly sized and consistently shaped. Thus, all the openings of stencil filter 74 are similarly shaped and sized. The same is true for the openings of stencil filters 76 and 78.

Figure 10:
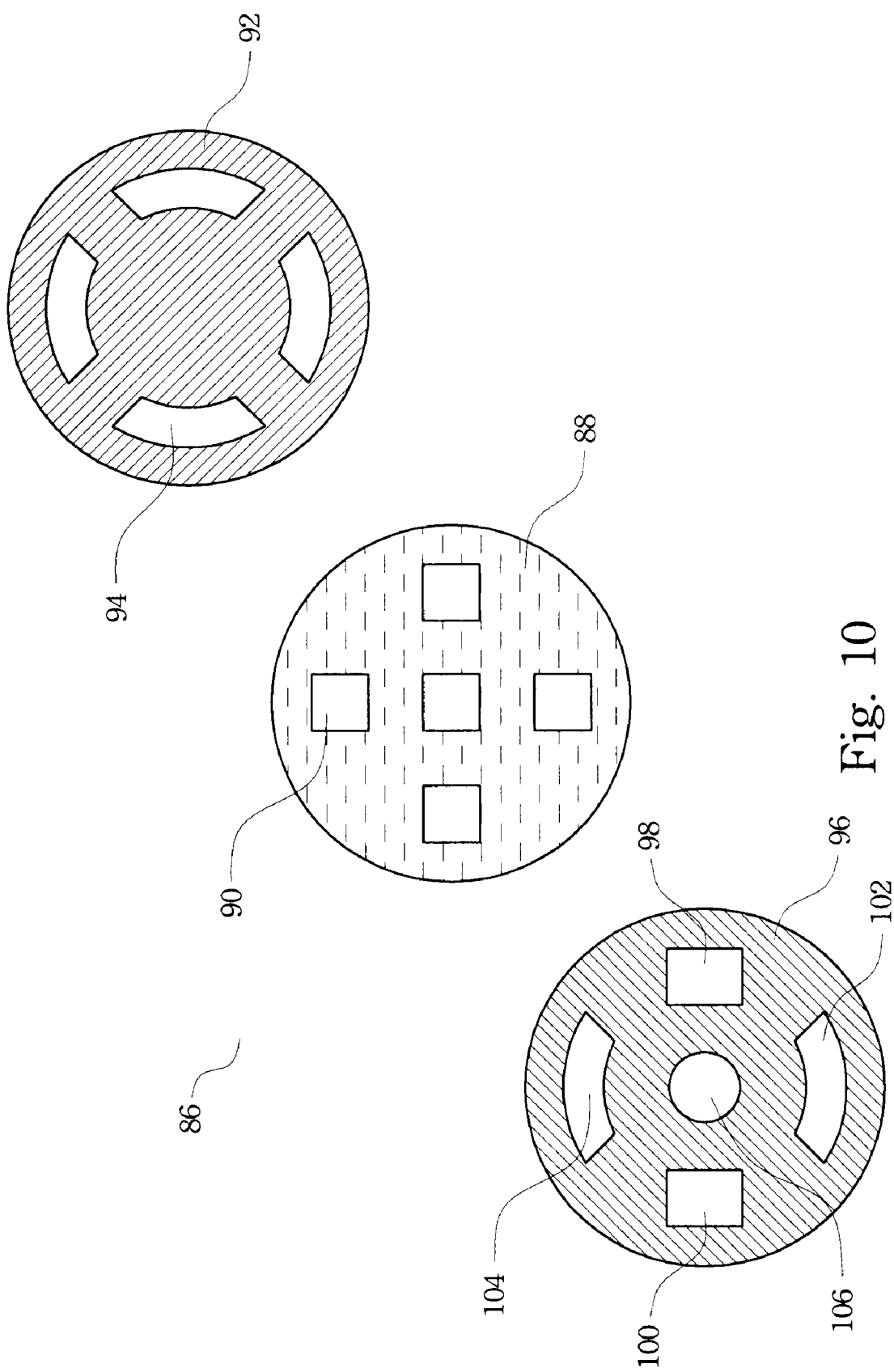
FIG. 10 is an exploded view of another filter assembly that is an alternative embodiment of the filter assembly of FIGS. 1-2.

FIG. 10 is a diagrammatic view of another exemplary filter assembly 86 that is a further alternate embodiment of the filter assembly 30 of FIG. 1. Filter assembly 86 has a stencil filter 96 with openings of different shape and size. Stencil filter 88 has five square openings 90 and stencil filter 92 has four truncated wedge shaped openings 94. Stencil filter 96 has five different openings 98, 100, 102, 104, and 106. The stencil filter 96 has two square openings 98 and 100, two truncated wedge shaped openings 102 and 104, and a single circular opening 106.

The stencil filters illustrated in FIGS. 8-10 are merely examples. In this regard, it is contemplated that the sizes, shapes, orientation, and arrangements of the stencil filters' openings can be different from those illustrated without departing from the scope of the present disclosure. It is also contemplated that more than two or three stencil filters can be used to generate uniquely shaped and sized plasma flow passages.

As mentioned above, it is contemplated that the stencil filters can be moved on-the-fly or in real-time during the course of a plasma etching recipe or process. This is illustrated in FIG. 11, which is a diagrammatic view of the filter assembly of FIGS. 1-2 showing relative positioning thereof over time. As shown, at a first time interval, e.g., 0-30 seconds, the actuators have positioned the filters in a first relative position. At a second time interval, e.g., 31-60 seconds, the actuators have repositioned the stencil filters 34 and 36 relative to one another to a second relative position. At a third time interval, e.g., 61-70 seconds, the actuators have repositioned the stencil filters to a third relative position. This relative repositioning of the stencil filters 34 and 36 can be continued throughout the etching process to achieve a desired etching profile. As illustrated in FIG. 11, the filters remain stationary relative to one another throughout each interval; however, alternately, it is contemplated that the filters can be repositioned relative to one another during an interval. It is also contemplated that the actuators can step to a desired relative position or cause continuous relative movement of the stencil filters 34 and 36. The stencil filters described with respect to FIGS. 2-9 can be similarly displaced relative to one another on-the-fly or in real-time during the course of a plasma etching process, or during transitions between similar or dissimilar plasma etching processes.

Figure 12:
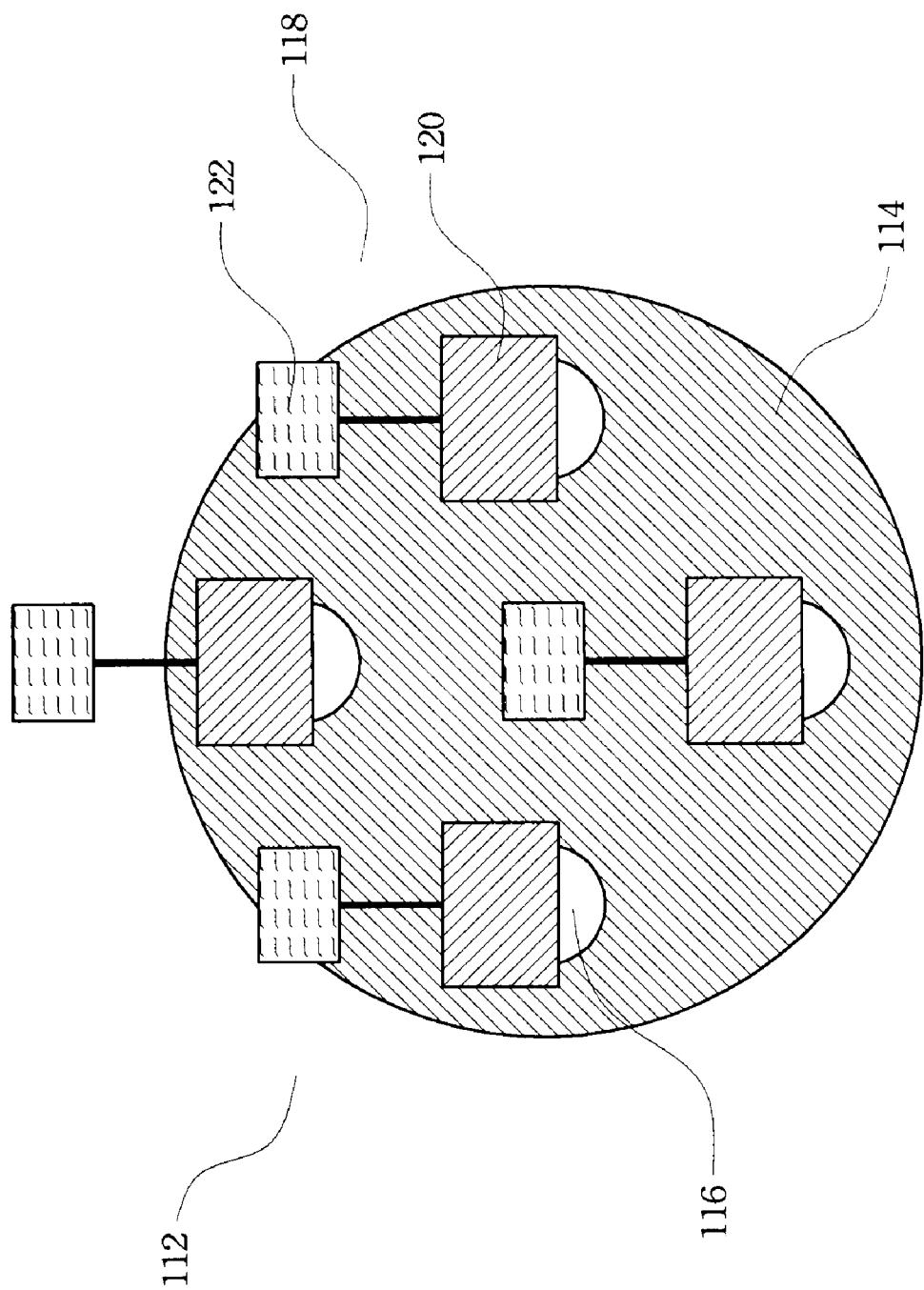
FIG. 12 is a diagrammatic view illustrating another filter assembly that is an alternative embodiment of the filter assembly of FIGS. 1-2.

FIG. 12 is a diagrammatic view illustrating another filter assembly that is an alternative embodiment of the filter assembly of FIGS. 1-2. Filter assembly 112 includes a stencil filter 114 having a series of openings 116 for passing plasma. A flow control valve 118 is disposed in close proximity to each opening 116. Each flow control valve 118 includes a gate 120 and an actuator 122 for independently sliding gate 120 over opening 116. In this regard, the size and shape of a plasma flow through each opening 116 can be independently varied to provide regional variations in plasma etching characteristics.

In another embodiment (not illustrated), all the flow control gates are controlled by a common actuator so that each gate opens and closes in unison. Also, while filter assembly 112 is shown as a stand-alone apparatus, it is contemplated that the filter assembly 112 could be combined or otherwise used with other filter assemblies, such as those described herein. It is also recognized that one or more gates 120 can be completely closed to vary the distribution of plasma.

Figure 13:
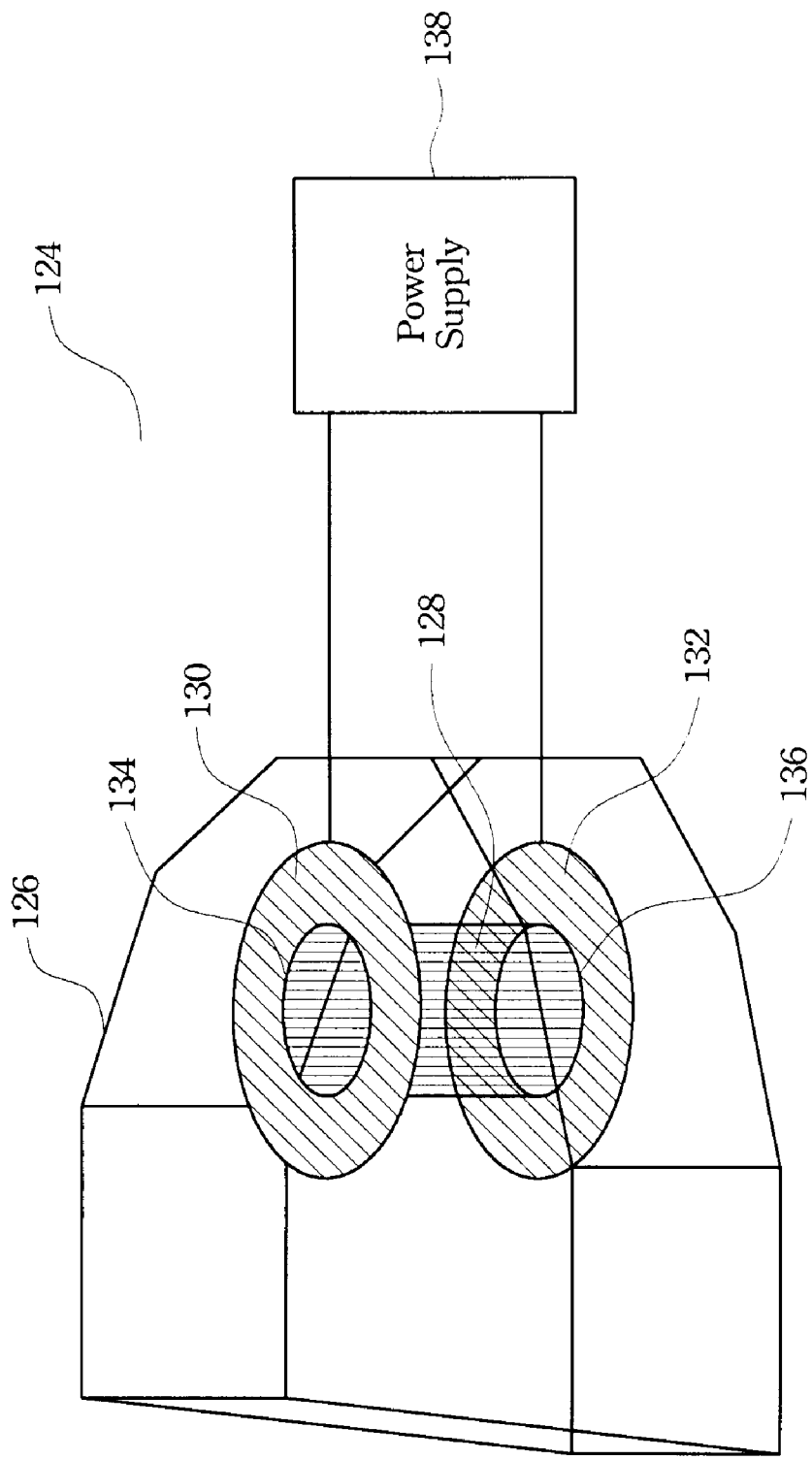
FIG. 13 is a fragmentary diagrammatic perspective view of another filter assembly that is an alternative embodiment of the filter assembly of FIGS. 1-2.

FIG. 13 is a fragmentary diagrammatic perspective view of another exemplary filter assembly 124 that is yet another alternative embodiment of the filter assembly 30 of FIG. 1. In this example, the filter assembly 124 includes a stencil filter 126. The stencil filter 126 has an opening 128 and a pair of annular electrodes 130 and 132.

One electrode 130 is positioned on a top surface of stencil filter 126 whereas electrode 132 is positioned on an undersurface of stencil filter 126. The two electrodes 130 and 132 are spaced from one another. As noted above, each electrode is annular and therefore includes a hole 134 and 136, respectively, through which plasma passes. Each hole 134 and 136 has a diameter equal to the diameter of opening 128. The shape of the holes 134 and 136 is matched to that of opening 128. While only a single opening 128 is shown, the filter has a plurality of openings with each opening aligned with a respective pair of electrodes.

The electrodes 130 and 132 are formed of metal or other conductive material. The electrodes are formed of a material that will not react with the plasma. Also, while the illustrated electrodes 130 and 132 are annular, it is contemplated that the electrodes may have other shapes.

The pair of electrodes 130 and 132 are coupled to a power supply 138 that includes a voltage source (not shown) and circuitry (not shown) to variably bias electrodes 130 and 132. As will be explained in greater detail below, by varying the voltage between the pair of electrodes 130 and 132, the speed by which certain plasma particles pass through the opening 130 can be varied. Moreover, as the stencil filter 132 has a plurality of openings with corresponding electrode pairs and power supplies, the speed of plasma particles passing through the respective openings can be independently controlled to provide regional variations in plasma etching characteristics.

Operation of the filter assembly 124 will be described with respect to FIGS. 1 and 14, with the assumption that the filter assembly 124 is used in place of filter assembly 30 in FIG. 1. As previously described, gas introduced into the vacuum chamber by gas source 20 is ionized into a plasma by high frequency power supplied to the vacuum chamber by the RF antenna 22. That plasma is then transported toward the wafer 12 by a voltage between the electric power supply 24 and grounding electrode 28. This potential between the electric power supply 24 and the grounding electrode 28, along with other factors, establishes the energy level at which plasma particles impinge upon the surface of the wafer 12. These particles include positive particles (ions) 140, negative particles (electrons) 142, and neutral particles (radicals) 144. As is generally well-known, the radicals are chiefly responsible for the chemical etching phenomena that occurs at the top surface of the wafer. The ions may assist with the etching process by bombarding the top surface of the wafer.

Figure 14:
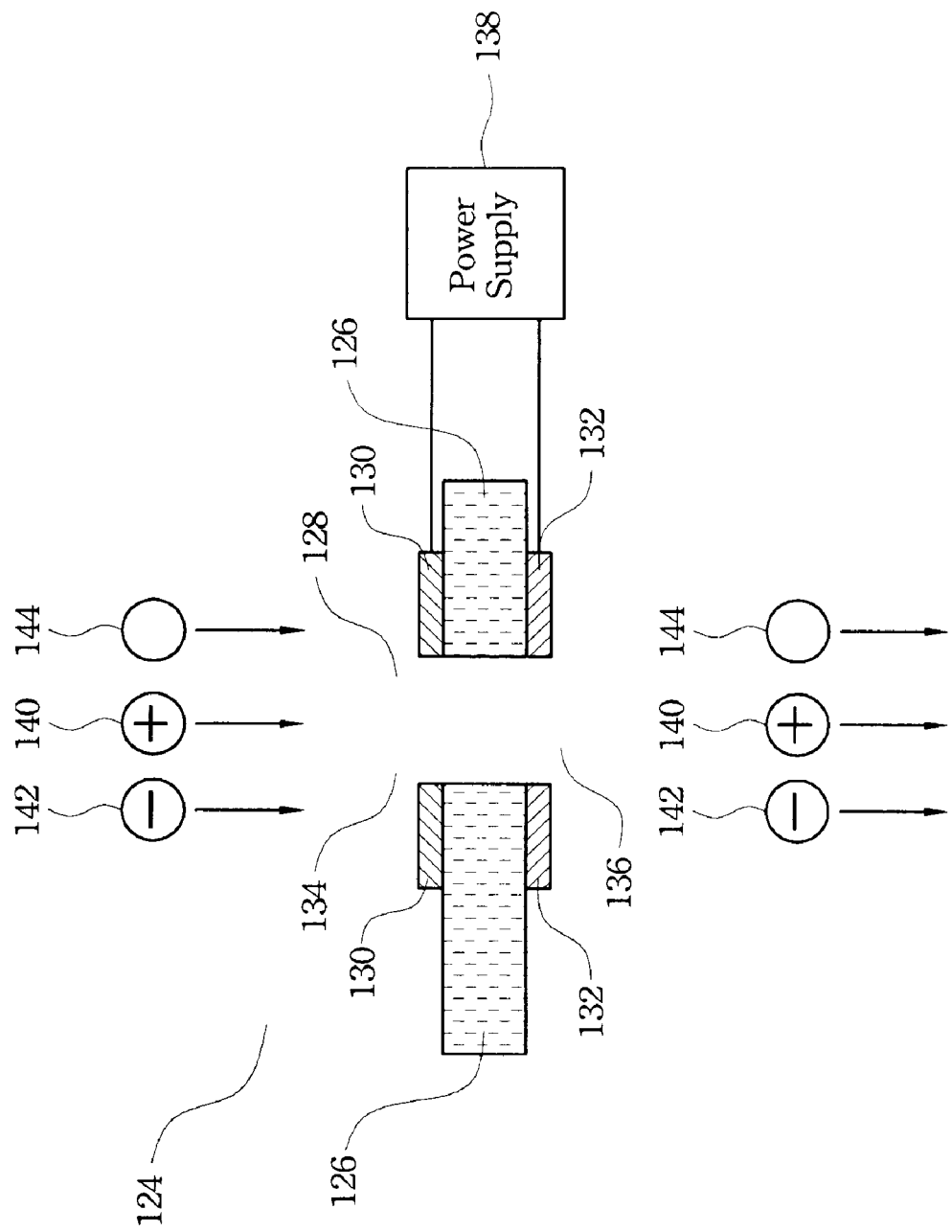
FIG. 14 is a diagrammatic fragmentary sectional side view of the filter assembly shown in FIG. 13.

Referring particularly to FIG. 14, the electrodes 130 and 132 together with power supply 138 create a localized potential transverse to the stencil filter 126. The voltage potential can be varied before or during active plasma etching to decelerate the ion (charged) particles 142 without affecting the radical (neutral) particles 144. As shown diagrammatically by vectors in FIG. 14, the particles are traveling at generally the same speed prior to reaching opening 128, but by virtue of the localized potential, the positive and neutral particles 140 and 144, respectively, are traveling faster than the negative particles 142 after passing through the plasma flow passage 128.

Figure 15:
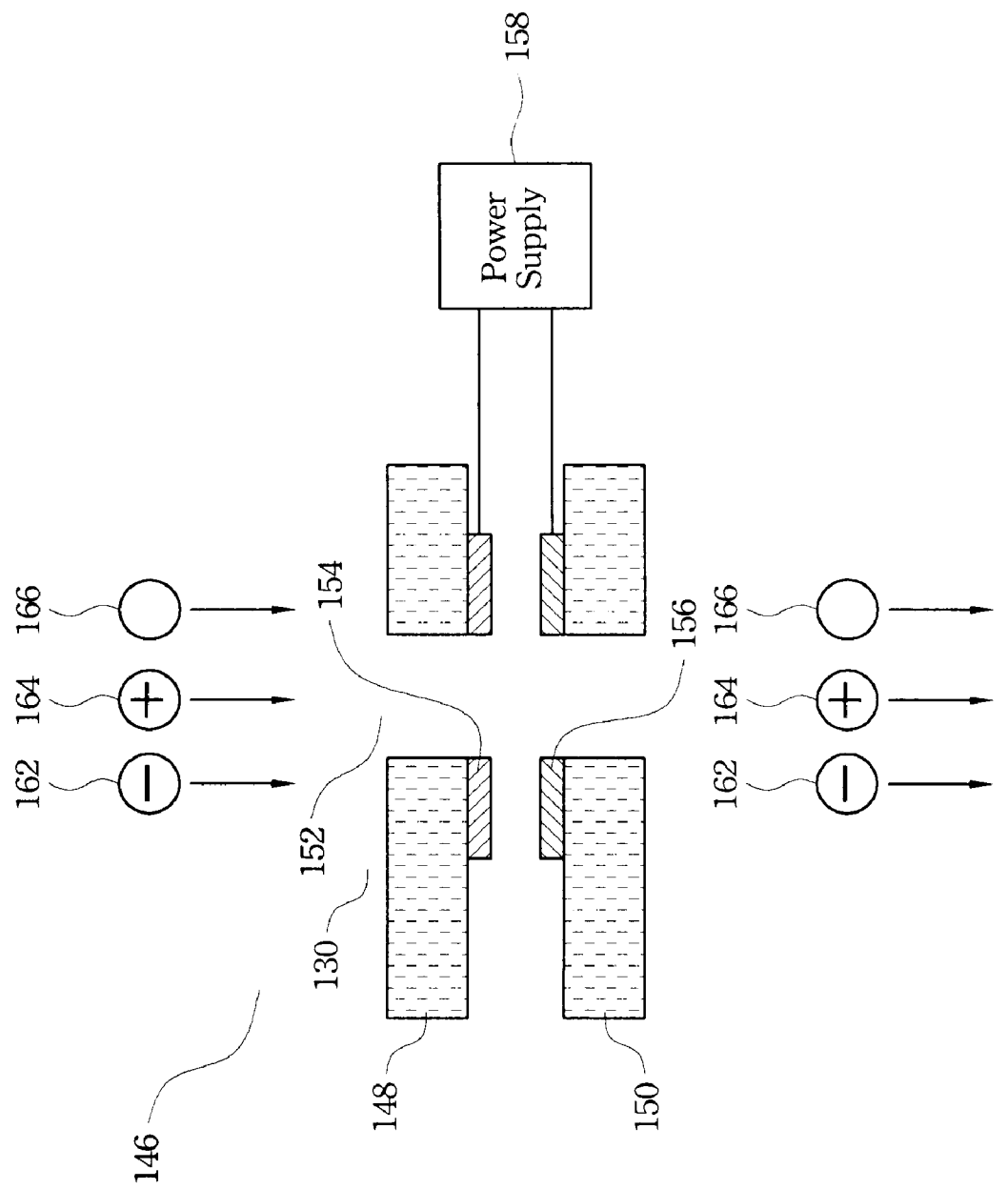
FIG. 15 is a diagrammatic fragmentary sectional side view illustrating another filter assembly that is that is an alternative embodiment of the filter assembly of FIGS. 1-2.

Referring now to FIG. 15, another exemplary filter assembly 146 is illustrated, and is a further alternative embodiment of the filter assembly 30 of FIG. 1. The filter assembly 146 has two spaced stencil filters 148 and 150. The two stencil filters 148 and 150 define a pair of aligned openings (not numbered) that collectively form a plasma flow passage 152. Two annular electrodes 154 and 156 are disposed in an interior volume 158 defined between the two stencil filters 148 and 150. In this regard, electrode 154 is disposed on an undersurface of filter 148 and electrode 156 is disposed on a top surface of filter 150. The electrodes 154 and 156 are spaced from one another such that a voltage potential can be created therebetween. The electrodes 154 and 156 are connected to a power supply 158 that controls the voltage between them to control the speed by which the plasma particles travel to the wafer.

Similar to the filter assembly 124 described with respect to FIG. 14, through voltage regulation, the speed of plasma particles (negative particles 162, positive particles 164, and neutral particles 166) can be controlled. As shown in the figure, the positive particles 164 and the neutral particles 166 are traveling faster toward the wafer (not shown) than the negative particles 162 as a result of the voltage between the electrodes 154 and 156.

The electrodes 154 and 156 are formed of metal or other conductive material. The electrodes are formed of a material that will not react with the plasma. Also, while the illustrated electrodes 154 and 156 are annular in their shape, it is contemplated that the electrodes may have other shapes.

Figure 16:
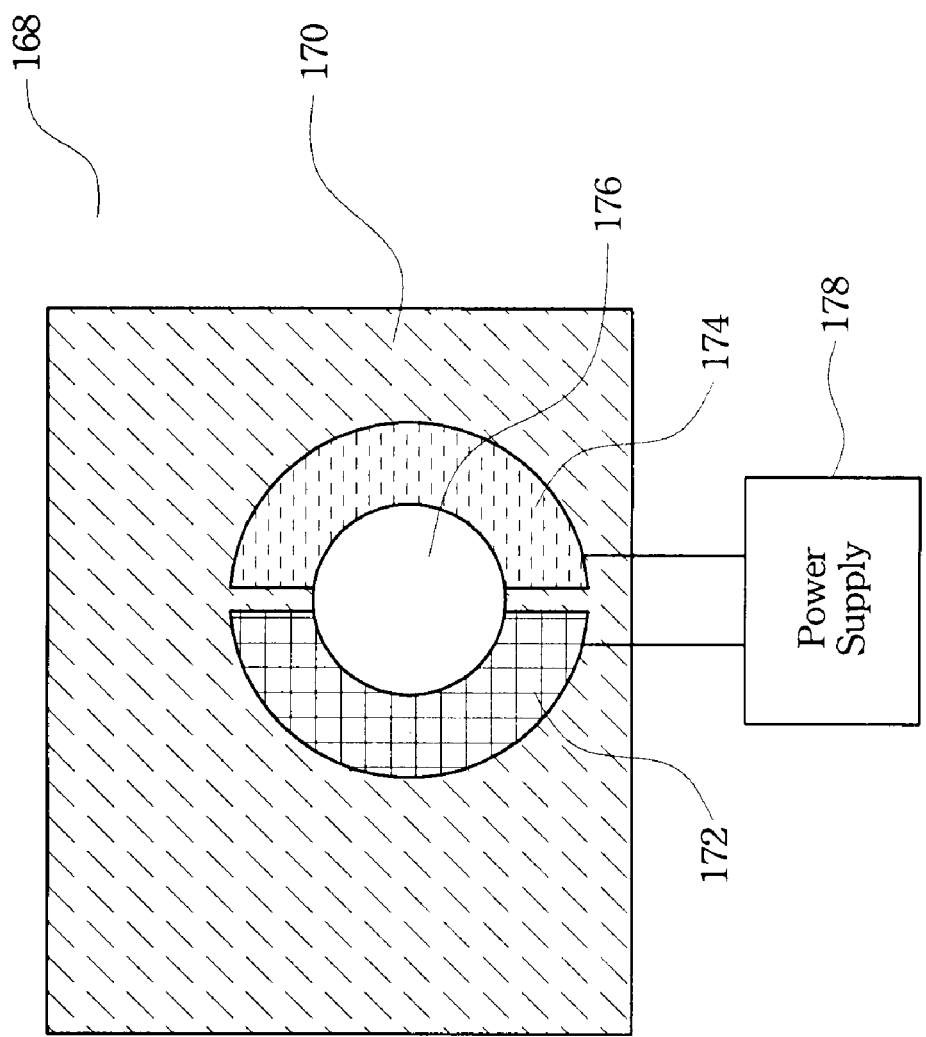
FIG. 16 is a fragmentary top view illustrating another filter assembly that is an alternative embodiment of the filter assembly of FIGS. 1-2.

FIG. 16 is a diagrammatic fragmentary top view of a portion of another exemplary plasma filter assembly 168 that is a further alternate embodiment of the filter assembly 30 of FIG. 1. As shown, the plasma filter assembly 168 includes a stencil filter 170 having a pair of spaced electrode inserts 172 and 174 disposed within opening 176. The electrode inserts 172 and 174 each have an arcuate shape with a curvature matched to that of opening 176. The electrode inserts 172 and 174 are transversely spaced from one another so that a voltage potential can be created therebetween by a power supply 178. In this regard, a voltage potential can be created transverse to the flow of plasma through opening 176.

The electrode inserts 172 and 174 are made of conductive material, such as metal, that does not react with the plasma. Additionally, the electrode inserts 172 and 174 are secured to the stencil filter 170 using a suitable adhesive; however, other mounting techniques may be used. Further, the shape of the electrode inserts illustrated in FIG. 16 is merely one contemplated example. It is recognized that the electrode inserts may have other shapes.

While the stencil filter 170 is shown as having only a single opening 176, it is contemplated that the stencil filter 170 may have more than one opening, each containing a pair of electrode inserts. Operation of plasma filter assembly 168 will be described with respect to FIG. 17.

Figure 17:
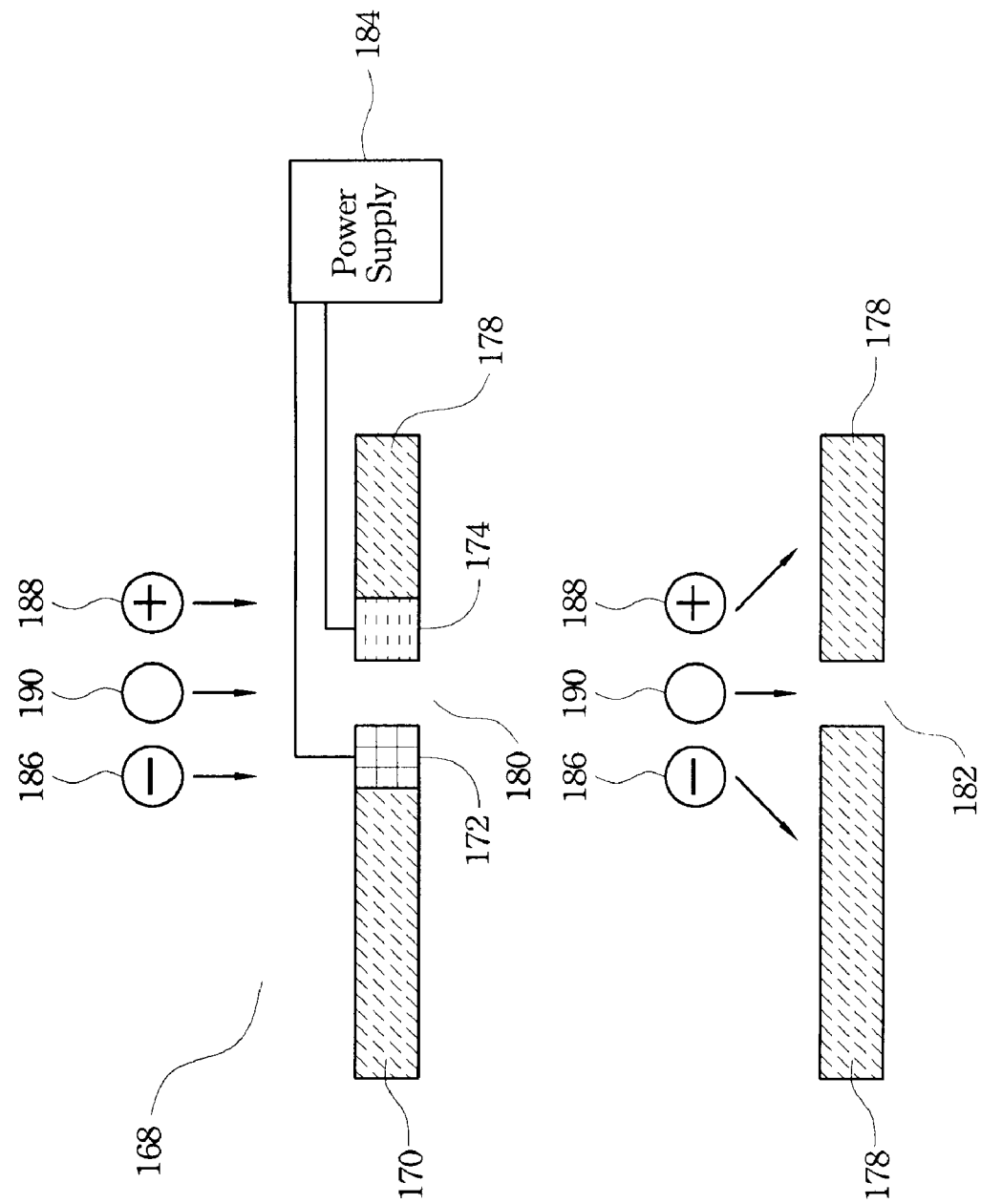
FIG. 17 is a fragmentary diagrammatic side view of the plasma filter assembly of FIG. 16.

FIG. 17 is diagrammatic sectional side view of the plasma filter assembly 168 of FIG. 16, including the stencil filter 170 and another stencil filter 178 that, as will be explained, blocks deflected plasma particles. The stencil filters 170 and 178 are generally aligned with one another and each define a respective portion 180 and 182 of a plasma flow passage. Stencil filter 170 includes the electrode inserts 172 and 174. The electrode inserts are biased by a power supply 184 that includes circuitry to vary the voltage between the electrode inserts 172 and 174. As such, the negative and positive particles 186 and 188 are deflected by the potential created across portion 180 of the plasma flow passage. The neutral or radical particles 190 are unaffected by the voltage potential and, as such, are not deflected.

Filter 178 lacks the electrode inserts that form part of stencil filter 170. Filter 178 blocks the deflected negative and positive particles 186 and 188. As such, the ratio of radicals to positive and negative particles is controlled by the deflective force imposed by the voltage between electrode inserts 172 and 174. The higher the voltage, the greater the deflection. It is contemplated that the electrode inserts 172 and 174 could be controlled such that no voltage is created therebetween which results in no deflection of the plasma particles.

It is recognized that stencil filters 170 and 178 may be fixed in position relative to another, or displaced relative to one another similar to that described with respect to FIGS. 2-11.

Figure 18:
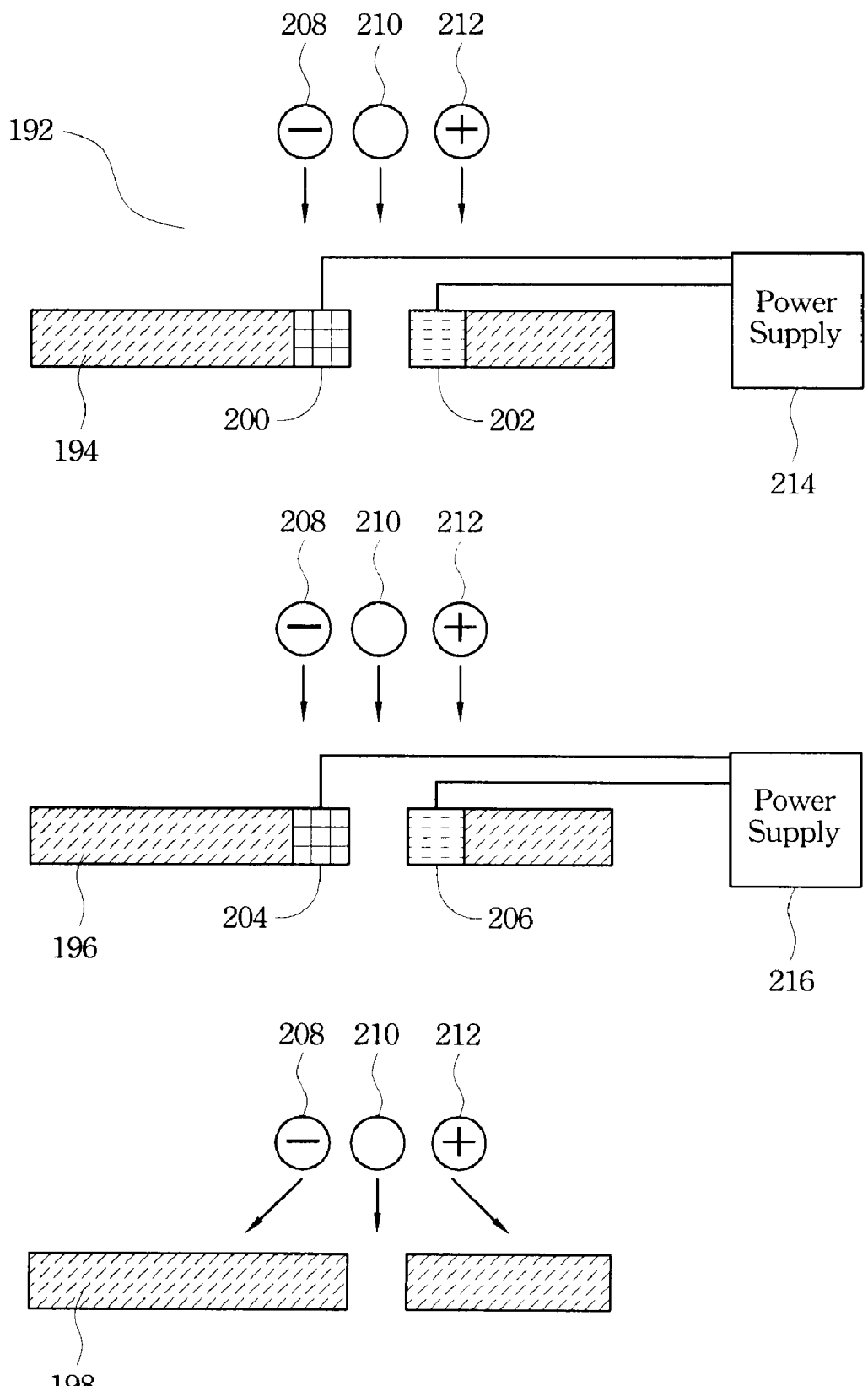
FIG. 18 is a fragmentary diagrammatic side view of another filter assembly that is an alternative embodiment of the filter assembly of FIGS. 1-2.

FIG. 18 illustrates another exemplary filter assembly 192 that is still another alternate embodiment of the filter assembly 30 of FIG. 1. In FIG. 18, the filter assembly 192 has three stencil filters 194, 196, and 198. Stencil filters 194 and 196 include electrode inserts 200, 202, 204, 206. Stencil filter 198 does not have any electrode inserts. In this regard, stencil filters 194 and 196 together with their respective electrode inserts provide a two-stage particle deflection and stencil filter 198 blocks the deflected particles. When the electrode inserts 200, 202, 204, and 206 are suitably biased, negative particles 208 in the plasma flow are repelled by electrode inserts 200 and 204 but are also attracted by electrode inserts 202 and 206, and similarly, positive particles 212 in the plasma are repelled by electrode inserts 202 and 206 but are attracted by electrode inserts 200 and 204. The neutral particles 210 are unaffected by the potential between the electrode inserts and therefore are not deflected.

The voltage between electrode inserts 204 and 206 is designed to deflect (or further deflect) negative and positive particles 208 and 212 that were not sufficiently deflected by the voltage between electrode inserts 200 and 202. The neutral particles 210 are unaffected by either of the voltages and, thus, are not blocked by either filter 196 or filter 198.

It is contemplated that the voltage between electrode inserts 200 and 202 can be more or less than that between electrode inserts 204 and 206. It is also contemplated that each pair of electrode inserts can be biased by a respective power source 214 and 216 as shown in the figure or connected to a common power source.

It is recognized that stencil filters 194, 196, and 198 may be fixed in position relative to another, or displaced relative to one another in a manner similar to that described with respect to FIGS. 2-11 to effectuate variations in plasma flow size.

Figure 19:
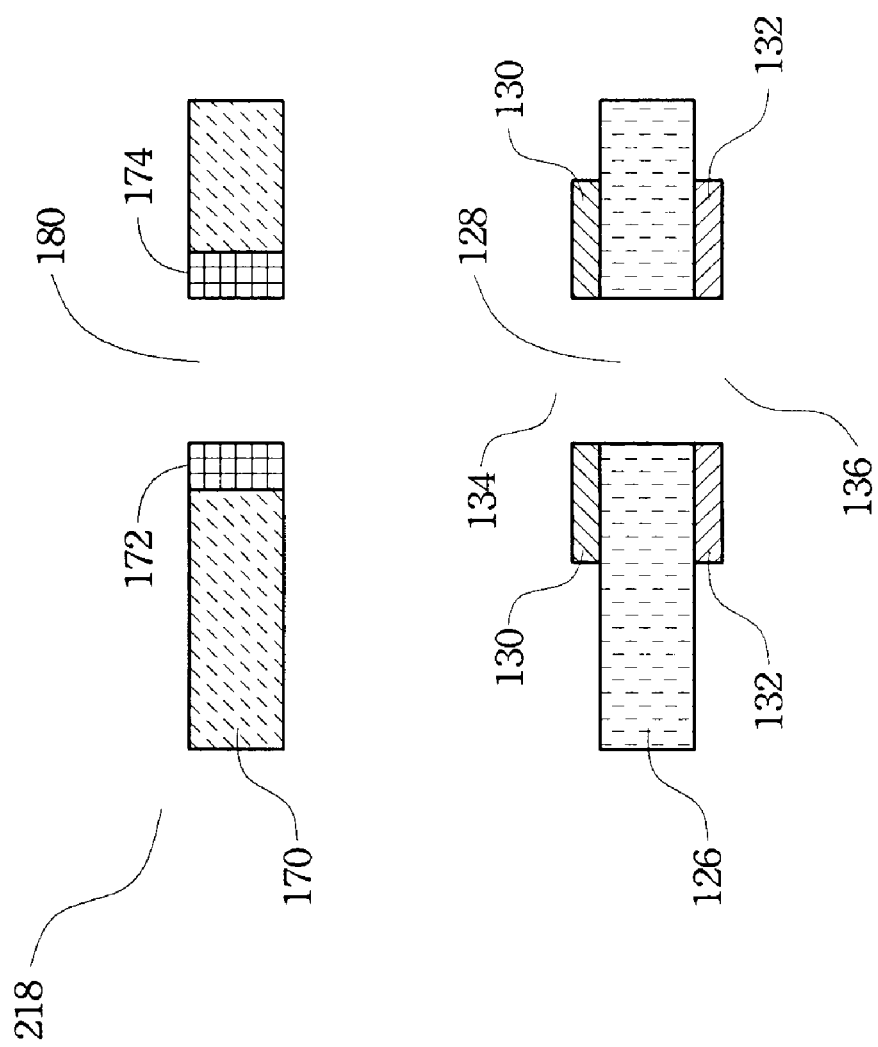
FIG. 19 is a fragmentary diagrammatic side view of another filter assembly that is an alternative embodiment of the filter assembly of FIGS. 1-2.

FIG. 19 is a fragmentary diagrammatic side view of another filter assembly that is an alternative embodiment of the filter assembly of FIGS. 1-2. The filter assembly 218 is an integration of the filter assemblies of FIGS. 14 and 17. That is, filter assembly 218 has a pair of spaced stencil filters 126 and 170 having respective openings 128 and 180 that collectively define a plasma flow passage. Stencil filter 170 includes electrode inserts 172 and 174 that impart a deflective force on certain plasma particles passing through opening 128. Stencil filter 126 includes annular electrodes 130 and 132 that affect the speed of certain particles passing through opening 128. Annular electrodes 130 and 132 have respective openings 134 and 136 that are aligned with opening 128 of the stencil filter 126. In addition to supporting electrodes 130 and 132 as well as defining another portion 128 of the plasma flow passage, stencil filter 126 also operates as a blocker for those plasma particles sufficiently deflected by the voltage between electrode inserts 172 and 174. The electrode inserts 172, 174 and annular electrodes 130, 132 are biased by a respective power supply (not shown). Alternately, the electrode inserts 172, 174 and annular electrodes 130, 132 are biased by the same power supply. Additionally, the stencil filters 126 and 170 may be moved relative to one another to vary the physical size of the plasma flow passage, in a manner similar to that described with respect to FIGS. 2-11.

It is recognized that the various disclosed filter assemblies can be integrated in other ways different from that shown in FIG. 19. Additionally, while the fragmentary view of filter assembly 218 shows openings 128 and 180 having the same cross-sectional shape, it is recognized that the openings can have different three-dimensional shapes.

Figure 20:
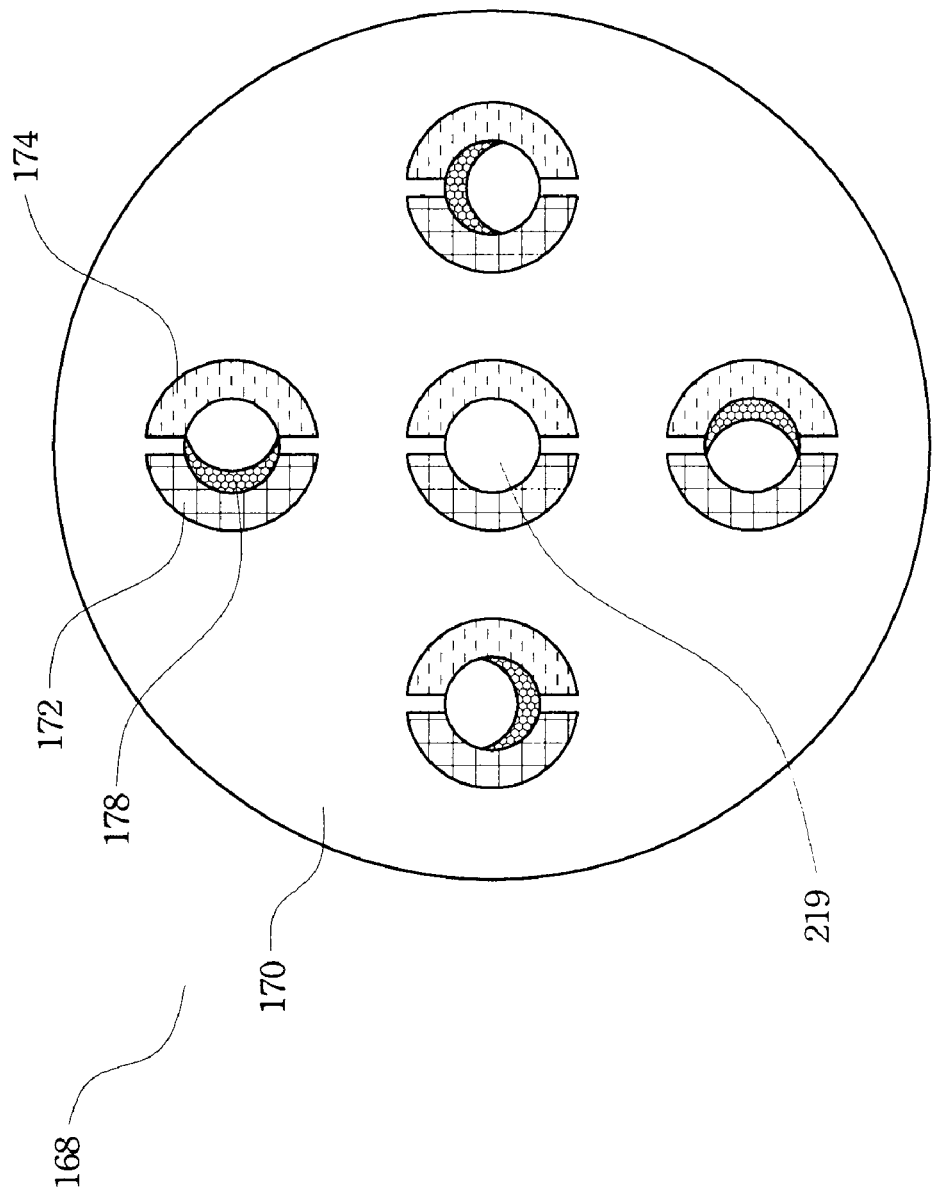
FIG. 20 is a diagrammatic top view of the plasma filter assembly of FIGS. 16-17.

FIG. 20 is a diagrammatic top view of the plasma filter assembly 168 of FIGS. 16-17 showing relative movement between stencil filters 170 and 172. As illustrated, stencil filter 178 has been rotated clockwise relative to stencil filter 170. This rotation occurs about an axis of a central plasma flow passage 219 defined by the respective openings 180 and 182 in the stencil filters. Stencil filter 170 includes arcuate electrode inserts 172 and 174. As described above, a voltage between the electrode inserts imposes a deflective force on certain particles passing through opening 180 (FIG. 17) of stencil filter 170. Moreover, the size of the plasma flow passage collectively defined through both stencil filters can be varied by relative movement of the stencil filters. In an alternate embodiment, one of the stencil filters includes particle speed-varying electrode plates (not shown) similar to those described with respect to FIG. 19, for example, to provide a filter assembly capable of varying the concentration, size, or speed of a plasma flow.

Figure 21:
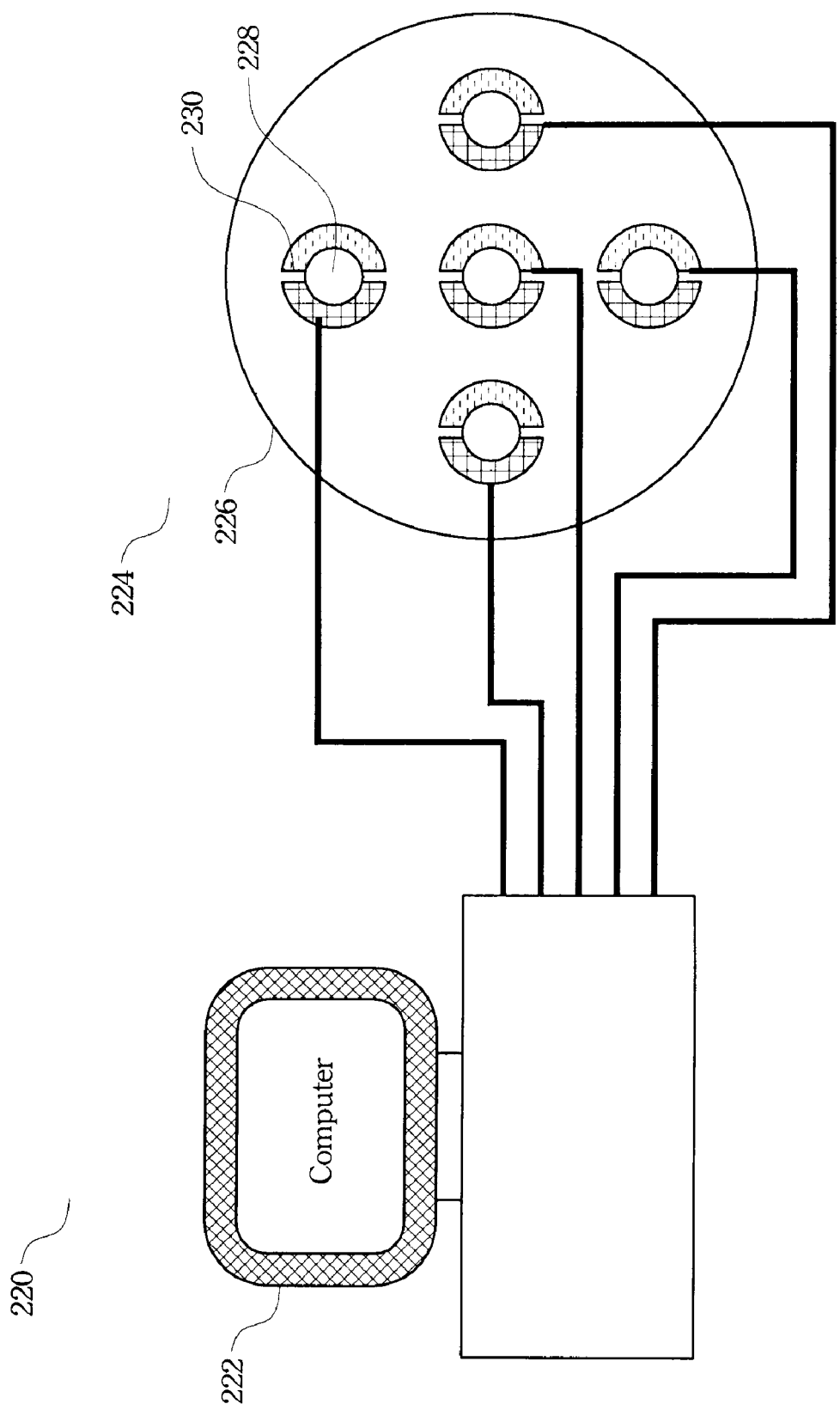
FIG. 21 is a diagrammatic view of a plasma control system.

FIG. 21 is a diagrammatic view of a plasma control system. As shown, plasma filter control system 220 includes a controller 222 and a filter assembly 224, such as that described herein. In this example, the filter assembly 224 includes a stencil filter 226 defining four plasma flow passages 228. Each plasma flow passage 228 is controlled by a respective electrode assembly 230. The controller independently controls the electrode assemblies 230 to effectuate variations in plasma flow. Controller 222 can execute a predefined voltage control of the electrodes or, alternatively, command on-the-fly voltage changes so that plasma characteristics are modified in (near) real-time. The controller 222 includes circuitry, memory, etc. to control the voltage between the electrodes.

Also, it is recognized that the filter assemblies described herein may also be controlled by a computer, controller, or processor similar to that shown in FIG. 19. The present disclosure has been described with respect to varying one or more plasma flow passages either mechanically or electrically. It is understood, however, that the plasma control structure may incorporate both mechanical and electrical controls. That is, it is recognized that a given plasma etching system may be equipped with multiple stencil filters movable relative to one another with one or more of the stencil filters having electrodes/electrode inserts to provide regional plasma etch control. Also, it is contemplated that filters can be arranged in groups. For example, four filters can be grouped into two sets and controlled accordingly. Moreover, it is contemplated that variations in plasma flow characteristics, such as size, speed, and concentration, can be varied during an active plasma etching process and/or during interruptions of a plasma etching process, or during transitions between similar or dissimilar plasma etching processes.

Accordingly, in one embodiment, an apparatus includes plasma control structure that defines a plasma flow passage and that can selectively vary a physical size of the plasma flow passage.

In another embodiment, a method includes providing a plasma control structure defining a plasma flow passage and selectively varying a physical size of the plasma flow passage.

In yet another embodiment, an apparatus includes plasma control structure defining a first plasma flow passage and a second plasma flow passage, and independently varies a speed of plasma flowing through the first and the second plasma flow passages.

According to another embodiment, a method includes providing a plasma control structure defining a first plasma flow passage and a second plasma flow passage, and selectively varying a speed of plasma flow through at least one of the first and the second plasma flow passages.

In another embodiment, an apparatus has plasma control structure that defines a first portion of a plasma flow passage and a second portion of the plasma flow passage, and that can influence plasma flowing through the first portion of the plasma flow passage such that a ratio of ions and radicals flowing through the second portion of the plasma flow passage is different from that which flowed through the first portion of the plasma flow passage.

According to another embodiment, a method includes providing a plasma control structure defining a first portion of a plasma flow passage and a second portion of a plasma flow passage, and imposing a deflective force relative to the first portion of the plasma flow passage to deflect particles of plasma flowing through the first portion of the plasma flow passage so that a ratio of particles in plasma flowing through the second portion of the plasma flow passage is different from that which flowed through the first portion of the plasma flow passage.

It is recognized that equivalents, alternatives, and modifications, aside from those expressly stated, are possible and within the scope of the appending claims.

What is claimed is:

1. A method comprising:
providing a plasma control structure defining a first portion of a plasma flow passage and a second portion of the plasma flow passage, wherein the first and second portions are linearly aligned with one another, the plasma control structure including spaced first and second electrodes associated with the first portion of the plasma flow passage, the first portion of the plasma flow passage extending between and being immediately adjacent each of the first and second electrodes;
passing plasma through the first portion of the plasma flow passage, wherein the plasma has first particles and second particles; and
imposing on the plasma passing through the first portion of the plasma flow passage a deflective force that influences the first particles but not the second particles so that a ratio of first particles to second particles in plasma flowing through the second portion of the plasma flow passage is different from that which flowed through the first portion of the plasma flow passage, wherein plasma flows successively through the first portion of the plasma flow passage and the second portion of the plasma flow passage, the imposing a deflective force including applying a voltage between the first and second electrodes, wherein the plasma control structure includes a first stencil filter with a first hole therethrough defining the first portion of the plasma flow passage and includes a second stencil filter with a second hole therethrough defining the second portion of the plasma flow passage, the first and second electrodes being placed at the first hole and separated from each other in a direction transverse to a direction of plasma flow.

2. The method of claim 1 further comprising varying a speed of one of the first particles and the second particles through the plasma flow passage.

3. The method of claim 1 wherein the imposing a deflective force includes varying the voltage to vary the deflective force.

4. The method of claim 1 further comprising varying a size of the plasma flow passage.

5. A method comprising:
providing a plasma control structure defining a first plasma flow passage and a second plasma flow passage, the first and second plasma flow passages being spaced from each other in a first direction and each extending substantially in a second direction perpendicular to the first direction;
passing a first portion of a plasma completely through the first plasma flow passage and simultaneously passing a second portion of the plasma completely through the second plasma flow passage, the first and second portions being of the same composition, and the first portion exiting the first plasma flow passage in the second direction and then traveling away from the first plasma flow passage in substantially the second direction; and
selectively varying a speed of the first portion in the region of the first plasma flow passage, without varying a speed of the second portion in the region of the second plasma flow passage.

6. The method of claim 5 wherein the plasma control structure includes a set of electrodes proximate the first plasma flow passage, and wherein the selectively varying includes applying a voltage between the electrodes and varying the voltage to vary the speed of the first portion through the first plasma flow passage.

7. The method of claim 5 further comprising varying a size of one of the first and second plasma flow passages.

8. The method of claim 5 including positioning a workpiece in the path of plasma that has passed through the first and second plasma flow passages, wherein the selectively varying provides regional variations in plasma etching on the workpiece.

9. The method of claim 8 further comprising varying a size of one of the first and second plasma flow passages, wherein the varying the size provides further regional variations in plasma etching on the workpiece.

10. A method comprising:
providing a plasma control structure defining a plasma flow passage;
selectively varying a physical size of the plasma flow passage; and
selectively varying a speed of a portion of plasma flowing through the plasma flow passage, the portion exiting the plasma flow passage in a direction and then traveling away from the plasma flow passage in substantially the direction, the plasma control structure including a first stencil filter with a hole therethrough, the hole defining the plasma flow passage, the first stencil filter including a first electrode and a second electrode, the first and second electrodes spaced apart from each other along the direction, further wherein selectively varying a speed includes varying a voltage across the first and second electrodes.

11. The method of claim 10 wherein the plasma control structure defines a first portion of the plasma flow passage and a second portion of the plasma flow passage, and wherein the selectively varying of the speed includes varying a speed of the portion of the plasma as it flows through the first portion of the plasma flow passage without varying the speed of the portion of the plasma as it flows through the second portion of the plasma flow passage.

12. The method of claim 10 further comprising halting a plasma flow through the plasma flow passage during a transition between a first plasma etching process and a second plasma etching process and carrying out the varying a physical size during the transition.

13. The method of claim 12 wherein the first plasma etching process is similar to the second plasma etching process.

14. The method of claim 12 wherein the first plasma etching process is dissimilar from the second plasma etching process.

15. The method of claim 12 wherein the varying a physical size occurs during a flowing of plasma through the plasma flow passage.

* * * * *